(12) United States Patent
Lin et al.

(10) Patent No.: US 12,293,946 B2
(45) Date of Patent: May 6, 2025

(54) TECHNIQUES FOR WAFER STACK PROCESSING

(71) Applicant: Taiwan Semiconductor Manufacturing Company, Ltd., Hsin-Chu (TW)

(72) Inventors: Yung-Lung Lin, Taichung (TW); Cheng-Hsien Chou, Tainan (TW); Cheng-Yuan Tsai, Chu-Pei (TW); Kuo-Ming Wu, Zhubei (TW); Hau-Yi Hsiao, Chiayi (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/076,701

(22) Filed: Dec. 7, 2022

(65) Prior Publication Data

US 2023/0101989 A1    Mar. 30, 2023

Related U.S. Application Data

(60) Continuation of application No. 17/406,249, filed on Aug. 19, 2021, now Pat. No. 11,545,395, which is a
(Continued)

(51) Int. Cl.
*H01L 21/822*    (2006.01)
*H01L 21/304*    (2006.01)
(Continued)

(52) U.S. Cl.
CPC ........ *H01L 21/8221* (2013.01); *H01L 21/304* (2013.01); *H01L 27/0688* (2013.01); *H01L 29/0657* (2013.01)

(58) Field of Classification Search
CPC ............... H01L 21/8221; H01L 21/304; H01L 27/0688; H01L 29/0657; H01L 21/78;
(Continued)

(56) References Cited

U.S. PATENT DOCUMENTS 7,727,860 B2    6/2010  Miyazaki et al.
8,679,944 B2    3/2014  Broekaart et al.
(Continued)

FOREIGN PATENT DOCUMENTS

CN    109786234 A    5/2019
JP    2005217319 A    8/2005

OTHER PUBLICATIONS

Notice of Allowance dated May 26, 2021 for U.S. Appl. No. 16/866,685.
(Continued)

*Primary Examiner* — David Vu
(74) *Attorney, Agent, or Firm* — Eschweiler & Potashnik, LLC

(57) ABSTRACT

The present disclosure, in some embodiments, relates to an integrated chip structure. The integrated chip structure includes a first substrate having a first horizontally extending surface and a second horizontally extending surface above the first horizontally extending surface as viewed in a cross-sectional view. The first horizontally extending surface continuously wraps around an outermost perimeter of the second horizontally extending surface in a closed loop as viewed in a plan-view. A second substrate is disposed over the first substrate and includes a third horizontally extending surface above the second horizontally extending surface as viewed in the cross-sectional view. The second horizontally extending surface continuously wraps around an outermost perimeter of the third horizontally extending surface in a closed loop as viewed in the plan-view.

20 Claims, 21 Drawing Sheets

Related U.S. Application Data division of application No. 16/866,685, filed on May 5, 2020, now Pat. No. 11,127,635.

(51) Int. Cl.
*H01L 27/06* (2006.01)
*H01L 29/06* (2006.01)

(58) Field of Classification Search
CPC . H01L 21/3043; H01L 25/071; H01L 21/187; H01L 21/561; H01L 23/49816; H01L 23/49838; H01L 23/5383; H01L 23/13; H01L 23/50; H01L 23/5386; H01L 24/80; H01L 25/0657
See application file for complete search history.

(56) References Cited

U.S. PATENT DOCUMENTS

| | | |
|---|---|---|
| 2011/0097874 A1 | 4/2011 | Broekaart et al. |
| 2012/0171861 A1 | 7/2012 | Park et al. |
| 2018/0138164 A1 | 5/2018 | Lee et al. |
| 2018/0226390 A1 | 8/2018 | Kang et al. |
| 2019/0287788 A1 | 9/2019 | Lin et al. |
| 2020/0402945 A1* | 12/2020 | Zeng ................. H01L 24/32 |

OTHER PUBLICATIONS

Notice of Allowance dated Sep. 14, 2022 for U.S. Appl. No. 17/406,249.

* cited by examiner

| Process | Trim 1 | Trim 2 | Trim 3 |
|---|---|---|---|
| A | Up-Cut | Up-Cut | Up-Cut |
| B | Up-Cut | Up-Cut | Down-Cut |
| C | Up-Cut | Down-Cut | Up-Cut |
| D | Down-Cut | Up-Cut | Up-Cut |
| E | Up-Cut | Down-Cut | Down-Cut |
| F | Down-Cut | Up-Cut | Down-Cut |
| G | Down-Cut | Down-Cut | Up-Cut |
| H | Down-Cut | Down-Cut | Down-Cut |

TECHNIQUES FOR WAFER STACK PROCESSING

REFERENCE TO RELATED APPLICATIONS

This Application is a Continuation of U.S. application Ser. No. 17/406,249, filed on Aug. 19, 2021, which is a Divisional of U.S. application Ser. No. 16/866,685, filed on May 5, 2020 (now U.S. Pat. No. 11,127,635, issued on Sep. 21, 2021). The contents of the above-referenced Patent Applications are hereby incorporated by reference in their entirety.

BACKGROUND

Many modern electronic devices use integrated circuits that are formed on semiconductor wafers during semiconductor device fabrication processes. Increasingly, semiconductor wafers may be stacked and bonded together to form three-dimensional integrated circuits (3DICs). 3DICs have a number of advantages over traditional two-dimensional integrated circuits (2DICs), such as higher device density, greater speed, and lower power consumption.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
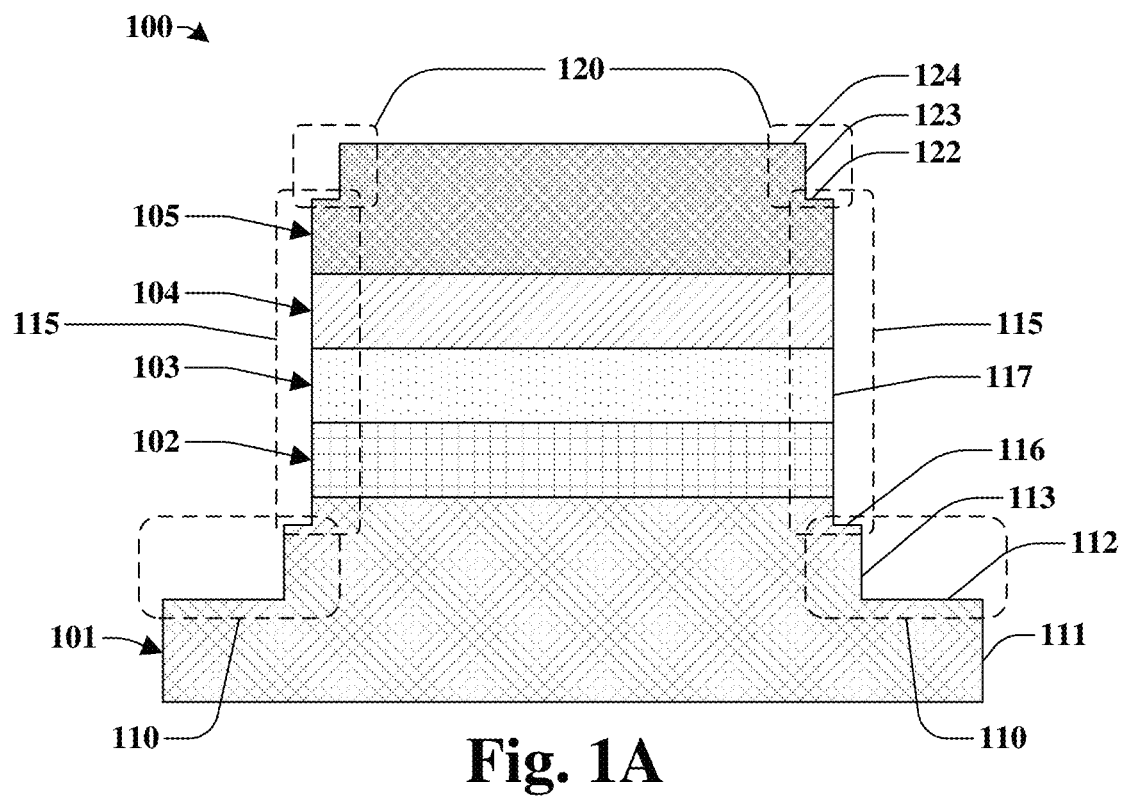
FIG. 1A illustrates a cross-sectional view of some embodiments of a multi-dimensional integrated chip structure that has undergone a multi-step edge trimming process.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

During semiconductor fabrication, integrated circuits may be formed on a semiconductor wafer. In many modern day applications, semiconductor wafers may be thinned down during fabrication to enable additional functionalities. For example, during the fabrication of a three-dimensional integrated circuit (3DIC), a semiconductor wafer may be thinned to enable the formation of through-substrate-vias (TSVs), which extend through the semiconductor wafer to allow for vertical connections between the semiconductor wafer and an adjacent semiconductor wafer within a 3DIC stack.

However, when a thickness of a semiconductor wafer is reduced to very thin dimensions (e.g., less than or equal to approximately 50 um) the semiconductor wafer becomes very flexible. To avoid damage to a thinned semiconductor wafer, the semiconductor wafer may be bonded to a support wafer (e.g., a carrier wafer) prior to the thinning process. The outer surface of a semiconductor wafer typically has a rounded shape as viewed in a cross-sectional view of the semiconductor wafer, which results in spaces between the semiconductor wafer and the support wafer along a periphery of the wafers. Because of the rounded shape, a thinning process will cause the semiconductor wafer to become thinner along an outer edge, resulting in a sharp outer edge with a low mechanical strength. The sharp outer edge can lead to chipping and/or flaking of the semiconductor wafer during subsequent processing.

To mitigate damage along an outer edge of the semiconductor wafer, edge trimming may be employed. Edge trimming is a process by which a blade is used to remove material from a periphery of a semiconductor wafer where incomplete bonding has occurred and/or will occur. By removing material from the periphery of the semiconductor wafer, formation of a sharp outer edge during thinning can be avoided, thereby mitigating damage along an edge of a thinned semiconductor wafer (e.g., chipping and/or flaking of the wafer).

One method of performing an edge trimming process on a 3DIC may be to form a semiconductor wafer stack comprising a plurality of semiconductor wafers, to grind an upper surface of the semiconductor wafer stack, and to subsequently trim an edge of the semiconductor wafer stack with a single and continuous edge trimming cut. However, it has been appreciated that such an edge trimming process exerts stresses on the semiconductor wafer stack that can damage the semiconductor wafer stack. For example, a side of a blade used during an edge trimming process may rub against a side of a stacked wafer structure resulting in a shear stress that causes peeling of dielectric layers within inter-level dielectric (ILD) layers of the stacked wafer structure. Similarly, the debris from the edge trimming process can accumulate along a surface of a wafer underlying the blade. When the blade pushes on the debris, it exerts a force on the surface that can lead to cracks in the wafer.

Embodiments of the present disclosure are directed toward a method of performing a multi-step edge trimming process for a multi-dimensional integrated chip structure that minimizes damage to the multi-dimensional integrated chip structure. The multi-step edge trimming process reduces stresses of the edge trimming process on the multi-dimensional integrated chip structure and therefore reduces damage to the multi-dimensional integrated chip structure. In some embodiments, the method may be performed by bonding a second wafer onto a top of a first wafer. A first edge trimming cut is performed along an outer edge of the second wafer. A second edge trimming cut is performed along edges of the first wafer and the second wafer, followed by a third edge trimming cut along edges of the first wafer. The first, second, or third edge trimming cuts may be performed using different types of edge trimming cuts that are configured to mitigate stresses on the multi-dimensional integrated chip structure. Therefore, the disclosed multi-step edge trimming process is able to mitigate damage to a multi-dimensional integrated chip structure.

FIG. 1A illustrates a cross-sectional view of some embodiments of a multi-dimensional integrated chip structure 100 that has undergone a multi-step edge trimming process.

The multi-dimensional integrated chip structure 100 comprises a plurality of substrates 101-105 stacked onto one another and bonded together. In some embodiments, the plurality of substrates 101-105 may comprise a first substrate 101, a second substrate 102, a third substrate 103, a fourth substrate 104, and a fifth substrate 105. In other embodiments, a different number of substrates may be stacked and bonded, such as two substrates, three substrates, four substrates, six substrates, or any other suitable number. In some embodiments, the plurality of substrates 101-105 may respectively comprise a semiconductor wafer (e.g., the first substrate 101 may comprise a first semiconductor wafer, the second substrate 102 may comprise a second semiconductor wafer, etc.). In some embodiments, one or more of the plurality of substrates 101-105 may further comprise an interconnect structure. In some embodiments, adjacent ones of the plurality of substrates 101-105 may be bonded together along bonding interface regions (not labeled).

The multi-dimensional integrated chip structure 100 comprises a plurality of surfaces defining multiple different cut regions 110, 115, and 120 (i.e., regions in which a multi-step edge trimming process has made a cut to remove a part of the multi-dimensional integrated chip structure 100). For example, in some embodiments, the multi-dimensional integrated chip structure 100 may comprise a first cut region 110, a second cut region 115, and a third cut region 120. The first cut region 110 is defined by a first upper surface 112 and a second outer edge 113 of the multi-dimensional integrated chip structure 100. In some embodiments, the first upper surface 112 may extend between a first outer edge 111 and the second outer edge 113. The second cut region 115 is defined by a second upper surface 116 and a third outer edge 117 of the multi-dimensional integrated chip structure 100. The third cut region 120 is defined by a third upper surface 122 and a fourth outer edge 123. In some embodiments, the fourth outer edge 123 may extend between the third upper surface 122 and a fourth upper surface 124. In some embodiments, the first upper surface 112 is a lowermost upper surface of the multi-dimensional integrated chip structure 100 and the fourth upper surface 124 is an uppermost upper surface of the multi-dimensional integrated chip structure 100. In some embodiments, the fourth upper surface 124 is a substantially planar surface.

In some embodiments, a first outermost perimeter of the first upper surface 112 is greater than a second outermost perimeter of the second upper surface 116. In some embodiments, a third outermost perimeter of the third upper surface 122 is less than the second outermost perimeter of the second upper surface 116. In some embodiments, the first substrate 101 may further comprise an uppermost surface having an outermost perimeter that is less than the second outermost perimeter and approximately equal to third outermost perimeter.

In some embodiments, the different cut regions 110, 115, and 120 may be formed by way of a same type of edge trimming cut. In other embodiments, different types of edge trimming cuts may be used to form the different cut regions 110, 115, and 120. In such embodiments, the different types of edge trimming cuts may exert different stresses on the multi-dimensional integrated chip structure 100, such that using different types of edge trimming cuts to form the different cut regions 110, 115, and 120 can reduce unwanted stresses on the multi-dimensional integrated chip structure 100 and mitigate damage that an edge trimming process causes on the multi-dimensional integrated chip structure 100.

For example, in some embodiments, the first cut region 110 may be formed by way of a first type of edge trimming cut that reduces a pressure on the first upper surface 112. By reducing a pressure on the first upper surface 112, cracking within the first substrate 101 can be mitigated. In some embodiments, the second cut region 115 may be formed by way of a second type of edge trimming cut that reduces a shear stress on the third outer edge 117. By reducing a shear stress on the third outer edge 117, peeling of dielectric layers within the multi-dimensional integrated chip structure 100 can be mitigated. In some embodiments, the third cut region 120 may be formed by way of the first type of edge trimming cut to reduce a pressure on the fourth upper surface 124. By reducing a pressure on the fourth upper surface 124, cracking within the fifth substrate 105 can be mitigated.

In some embodiments, the different types of edge trimming cuts may comprise an "up-cut" (i.e., an edge trimming cut in which a spinning blade is brought into contact with a rotating substrate, so that the spinning blade turns around an axis in a manner that causes the blade between the axis and the substrate to travel in a same direction as the substrate) and a "down-cut" (i.e., an edge trimming cut in which a spinning blade is brought into contact with a rotating substrate, so that the spinning blade turns around an axis in a manner that causes the blade between the axis and the substrate to travel in an opposite direction as the substrate).

Figure 1B:
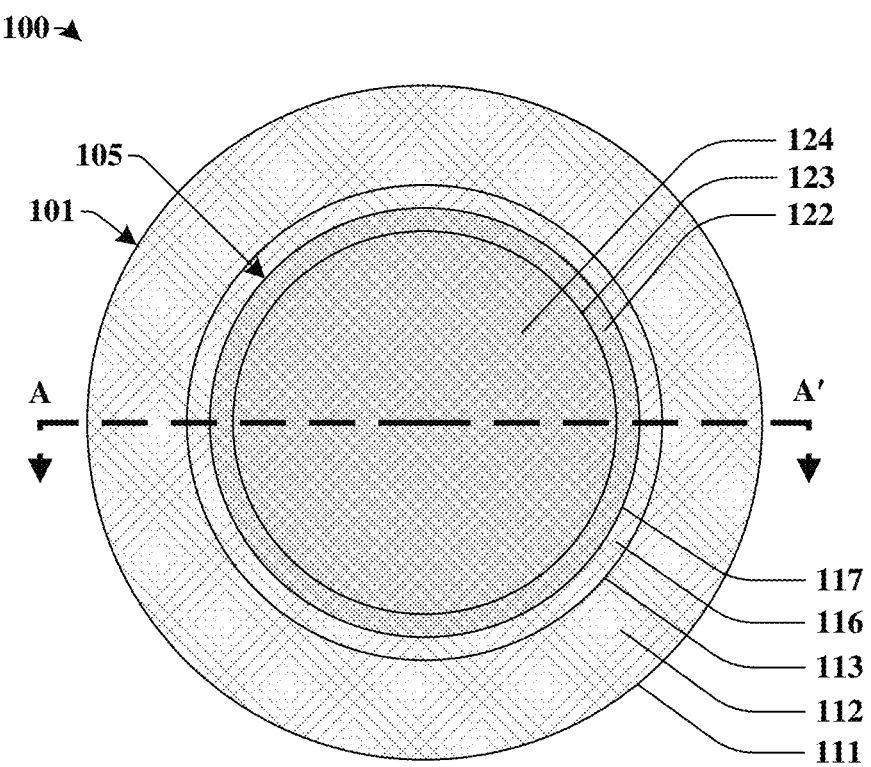
FIG. 1B illustrates a top view of some embodiments of the multi-dimensional integrated chip structure of FIG. 1A.

Referring to FIG. 1B, a top view of the multi-dimensional integrated chip structure 100 of FIG. 1A in accordance with some embodiments is provided. In some embodiments, the cross-sectional view of the multi-dimensional integrated chip structure 100 of FIG. 1A is taken across the line A-A'.

In some embodiments, the first outer edge 111 surrounds the second outer edge 113, the third outer edge 117, and the fourth outer edge 123. In some embodiments, the plurality of substrate 101-105 are circular-shaped wafers. In some embodiments, the plurality of substrates 101-105 comprise concentric wafers. In some embodiments, the aforementioned outer edges are circular, the first outer edge 111 having a greater radius than the second outer edge 113, the second outer edge 113 having a greater radius than the third outer edge 117, and the third outer edge 117 having a greater radius than the fourth outer edge 123.

Figure 2A:
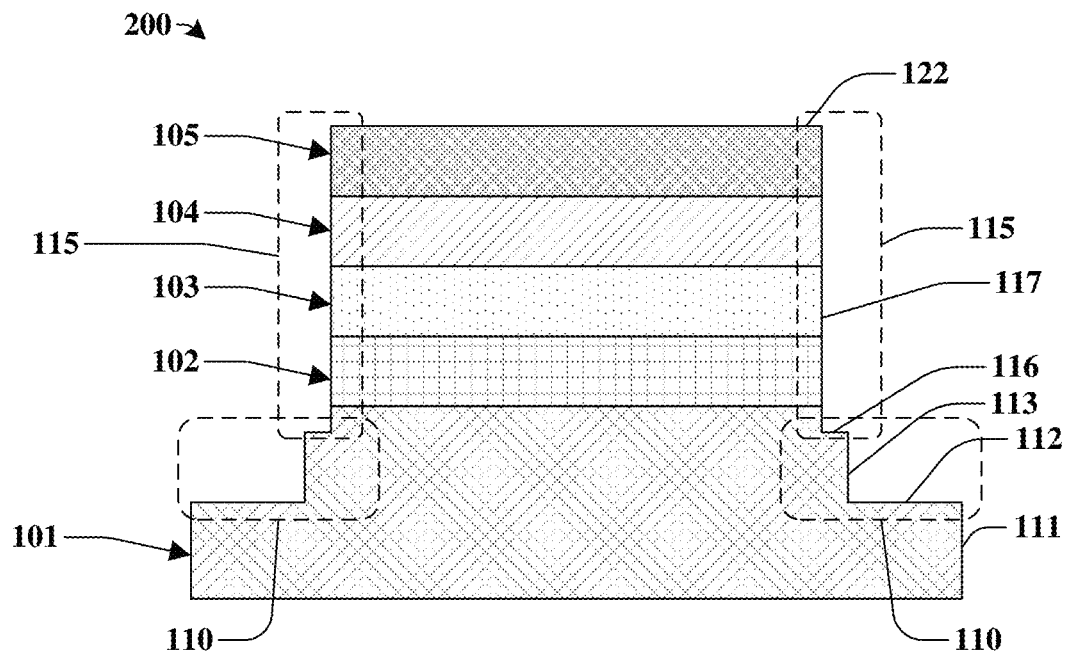
FIG. 2A illustrates a cross-sectional view of some additional embodiments of a multi-dimensional integrated chip structure that has undergone a multi-step edge trimming process.

Referring to FIG. 2A, a cross-sectional view of a multi-dimensional integrated chip structure 200 in accordance with some embodiments is provided.

In the embodiment illustrated in FIG. 2A, the third upper surface 122 is the uppermost surface of the of the multi-dimensional integrated chip structure 200. Because the third upper surface 122 is the uppermost surface of the multi-dimensional integrated chip structure 200, the multi-dimensional integrated chip structure 200 has two cut regions. In some embodiments, the third upper surface 122 is substantially planar and extends between outermost sidewalls of the fifth substrate 105.

Figure 2B:
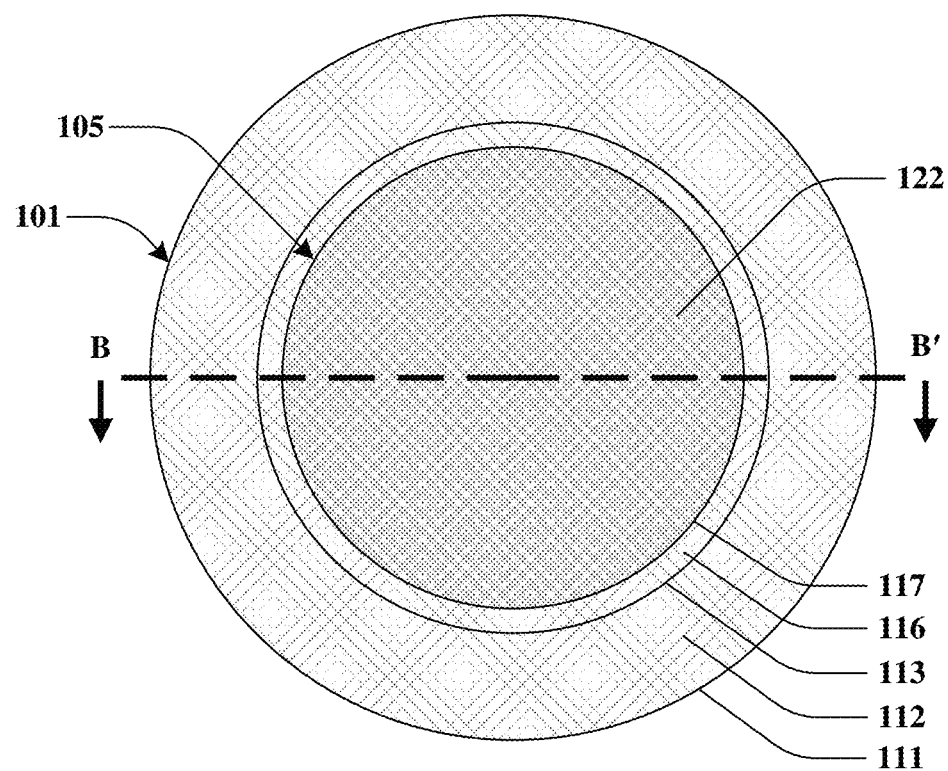
FIG. 2B illustrates a top view of some embodiments of the multi-dimensional integrated chip structure of FIG. 2A.

Referring to FIG. 2B, a top view of the multi-dimensional integrated chip structure 200 of FIG. 2A in accordance with some embodiments is provided. In some embodiments, the cross-sectional view of the multi-dimensional integrated chip structure 200 of FIG. 2A is taken across the line B-B'. As discussed above with regard to FIG. 2A, the multi-dimensional integrated chip structure 200 has three upper surfaces and two cut regions.

Figure 3:
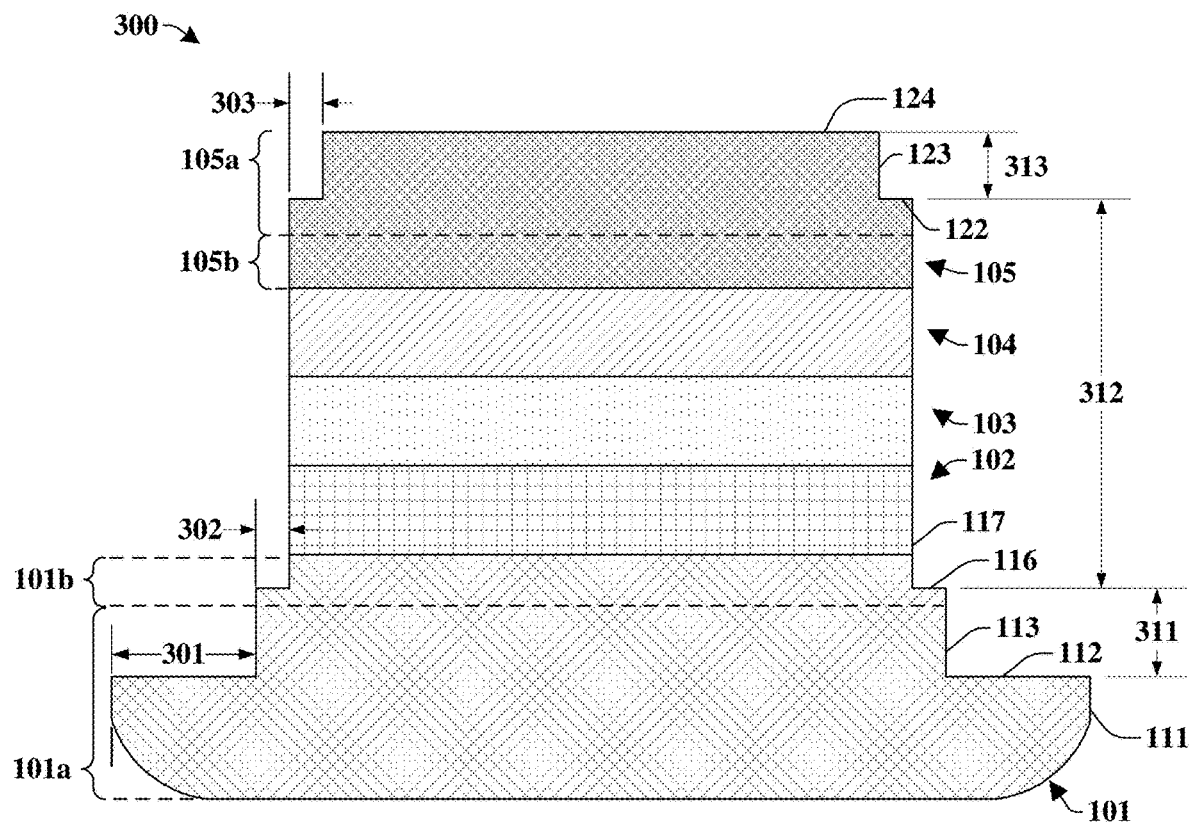
FIG. 3 illustrates a cross-sectional view of some additional embodiments of a disclosed multi-dimensional integrated chip structure.

Referring to FIG. 3, a cross-sectional view of some additional embodiments of a multi-dimensional integrated chip structure 300 is provided.

The multi-dimensional integrated chip structure 300 comprises a plurality of substrates 101-105. In some embodiments, one or more of the plurality of substrates 101-105 respectively comprise a semiconductor substrate and an overlying interconnect region. For example, a first substrate 101 may comprise a first semiconductor substrate 101a and a first interconnect structure 101b. The semiconductor substrates may comprise a semiconductor material such as silicon, germanium, or the like. The interconnect structure may comprise a plurality of conductive interconnect layers disposed within a dielectric structure comprising stacked inter-level dielectric (ILD) layers.

The plurality of substrates 101-105 define a first outer edge 111, a second outer edge 113, a third outer edge 117, and a fourth outer edge 123. In some embodiments, a first width 301 extends between the first outer edge 111 and the second outer edge 113, a second width 302 extends between the second outer edge 113 and the third outer edge 117, and a third width 303 extends between the third outer edge 117 and the fourth outer edge 123. In some embodiments, the first width 301, the second width 302, and the third width 303 are at least 10 micrometers wide. Having a width of at least 10 micrometers avoids damage by an edge trimming process used to form the first cut region 110, the second cut region 115, and the third cut region 120. In other embodiments, the first width 301, the second width 302, and the third width 303 may be between approximately 10 micrometers and approximately 250 micrometers, between approximately 10 micrometers and approximately 500 micrometers, or other suitable values. In some embodiments, the first width 301 may be wider than the second width 302 and the third width 303. In some embodiments, the first width 301 may be set back from a vertical line along a beveled edge of the first substrate 101 by a distance of approximately 3 millimeters, approximately 5 millimeters, or other suitable values.

In some embodiments, the third cut region 120 may have a height that is between 0.5 and 20 times that of the first width 301. In some embodiments, the second cut region 120 may have a height that is between 2 and 30 times that of the second width 302. In some embodiments, the third cut region 120 may have a height that is between 0.05 and 50 times that of the width In some embodiments, a first depth 311 extends between the first upper surface 112 and the second upper surface 116, a second depth 312 extends between the second upper surface 116 and the third upper surface 122, and a third depth 313 extends between the third upper surface 122 and the fourth upper surface 124. In some embodiments, the first depth 311 is less than a distance between the second upper surface 116 and a lowermost surface of a first substrate 101, the second depth 312 is greater than a distance between the third upper surface 122 and an uppermost surface of the first substrate 101 (i.e. greater than a depth of a bonding interface between the plurality of substrates 101-105 (not labeled)), and the third depth 313 is less than a total thickness of the fifth substrate 105. In embodiments where the multi-dimensional integrated chip structure 300 comprises the fourth upper surface 124, the third depth 313 is non-zero. However, it should be appreciated that in some embodiments (e.g., the multi-dimensional integrated chip structure 200 illustrated in FIGS. 2A and 2B), the third depth 313 may be approximately zero.

In some embodiments, the second outer edge 113 vertically extends from below the first interconnect structure 101b to within the first semiconductor substrate 101a. Because the second outer edge 113 vertically extends from below the first interconnect structure 101b to within the first semiconductor substrate 101a, the second outer edge 113 can be formed using a first edge trimming cut having a relatively high shear stress and low pressure (since the blade used to form the second outer edge 113 may not contact the dielectric material of an interconnect structure).

In some embodiments, the third outer edge 117 vertically extends from below the first interconnect structure 101b to over a fifth interconnect structure 105b of the fifth substrate 105. Because the third outer edge 117 vertically extends from below the first interconnect structure 101b to within the first semiconductor substrate 101a, a second edge trimming cut having a relatively low shear stress (e.g., lower than the first edge trimming cut) and high pressure (e.g., higher than the first edge trimming cut) can be used to form the third outer edge 117. The relatively low shear stress will reduce damage (e.g., peeling) to the dielectric materials of interconnect structures of the plurality of substrates 101-105.

In some embodiments, the fourth outer edge 123 vertically extends from a top of the fifth substrate 105 to above the fifth interconnect structure 105a. Because the fourth outer edge 123 vertically extends from a top of the fifth substrate 105 to above the fifth interconnect structure 105a, the fourth outer edge 123 can be formed using a third edge trimming cut having a relatively low pressure (e.g., lower than the second edge trimming cut) and high pressure (e.g., higher than the second edge trimming cut).

Figure 4A:
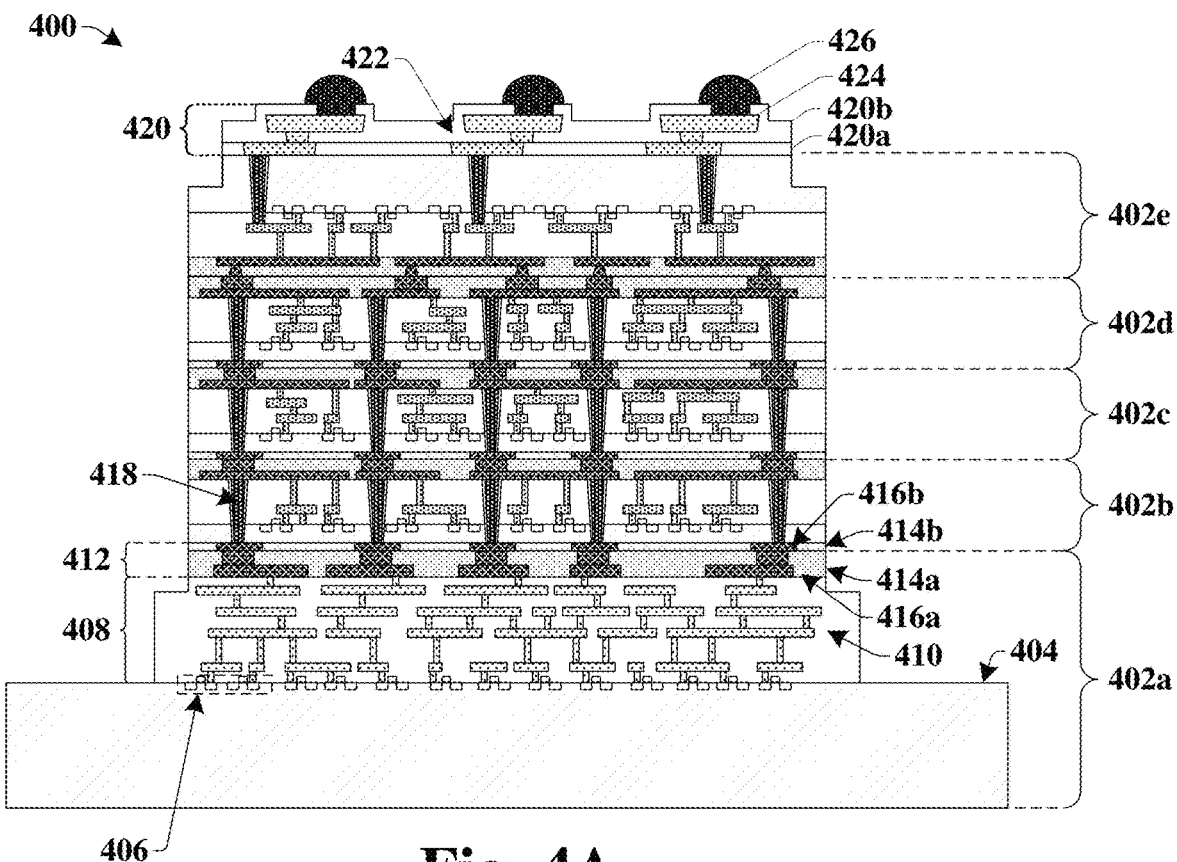
FIG. 4A illustrates a cross-sectional view of some additional embodiments of a multi-dimensional integrated chip structure.

Referring to FIG. 4A, a detailed cross-sectional view of some embodiments of a multi-dimensional integrated chip structure 400 is provided.

The multi-dimensional integrated chip structure 400 comprises a plurality of tiers 402a-402e. The plurality of tiers 402a-402e, respectively comprising a semiconductor substrate 404. In some embodiments, the semiconductor substrate 404 may comprise a semiconductor wafer. A plurality of transistor devices 406 may be disposed within a plurality of separate die regions of the semiconductor substrate 404, which respectively correspond to an integrated chip die within the semiconductor wafer. One or more of the plurality of tiers 402a-402e may further comprise an interconnect structure 408 disposed on the semiconductor substrate 404. The interconnect structure 408 comprises a plurality of conductive interconnect layers 410 disposed within a dielectric structure comprising one or more stacked inter-level dielectric layers. The plurality of conductive interconnect layers 410 are electrically coupled to the plurality of transistor devices 406. In some embodiments, the plurality of conductive interconnect layers 410 may comprise conductive contacts, interconnect wires, and/or interconnect vias. In some embodiments, the plurality of conductive interconnect layers 410 may comprise copper, tungsten, aluminum, and/or the like.

In some embodiments, the plurality of tiers 402a-402e may be bonded together by way of a hybrid bonding region 412. In such embodiments, the hybrid bonding region 412 comprises a first plurality of conductive bond features 414a disposed within a first dielectric layer 416a and a second plurality of conductive bond features 414b disposed within a second dielectric layer 416b. In some embodiments, the first plurality of conductive bond features 414a and the second plurality of conductive bond features 414b may comprise copper, aluminum, or the like. In some embodiments the first dielectric layer 416a and the second dielectric layer 416b may comprise an oxide, a nitride, or the like. Within the hybrid bonding region 412, the first plurality of conductive bond features 414a contact the second plurality of conductive bond features 414b along a first interface and the first dielectric layer 416a contacts the second dielectric layer 416b along a second interface.

In some embodiments, a through-substrate vias (TSVs) 418 may extend through the semiconductor substrate 404 of one or more of the plurality of tiers 402a-402e. The TSVs 418 are configured to provide an electrical connection between interconnect structures of the plurality of tiers 402a-402e.

In some embodiments, a passivation structure 420 comprising one or more passivation layers 420a-420b is disposed over a topmost one of the plurality of tiers 402a-402e. In some embodiments, one or more redistribution layers 422 may be disposed within the passivation structure 420. The one or more redistribution layers 422 may be configured to electrically couple the plurality of IC die 402a-402c to a bond pad 424 disposed on or over the passivation structure 420. In some embodiments, a conductive solder bump 426 is disposed onto the bond pad 424.

In some embodiments, any of the plurality of tiers 402a-402e may comprise a complementary metal-oxide-semiconductor (CMOS) device, a CMOS Image Sensor (CIS), a Dynamic Random-Access-Memory (DRAM) device, an application-specific integrated circuit (ASIC), a microelectromechanical system (MEMS), radio frequency (RF) circuitry, analog circuitry, a microprocessor unit (MPU), or any other suitable device or circuitry.

Figure 4B:
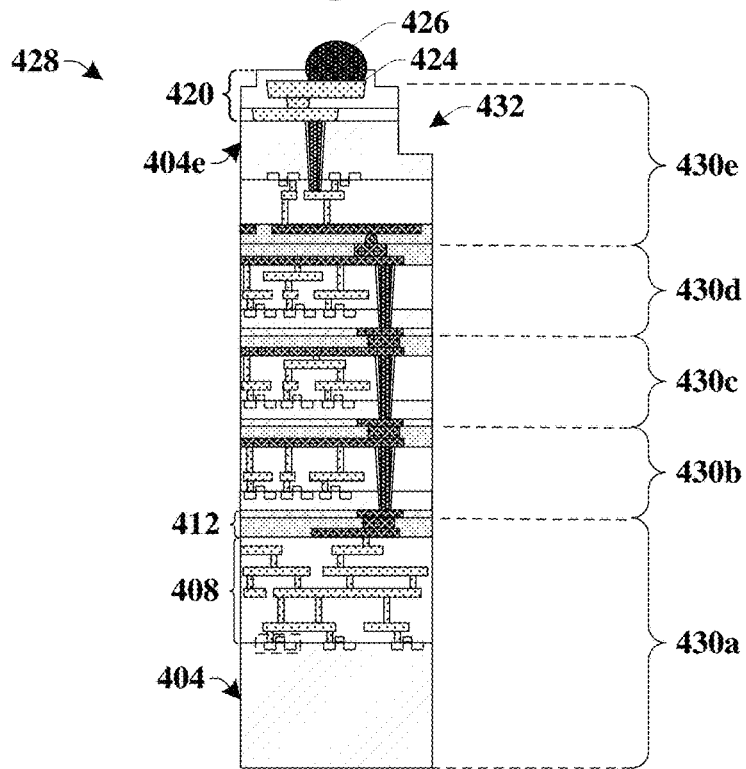
FIG. 4B illustrates a cross-sectional view of some embodiments of a multi-dimensional integrated chip die cut from the multi-dimensional integrated chip structure of FIG. 4A.

Referring to FIG. 4B, a detailed cross-sectional view of some embodiments of a multi-dimensional integrated chip die 428 diced from the multi-dimensional integrated chip structure 400 illustrated in FIG. 4A.

In some embodiments, the multi-dimensional integrated chip die 428 comprises a plurality of integrated chip (IC) die 430a-430e stacked onto one another. The plurality of IC die 430a-430e respectively comprise an interconnect structure 408 disposed on a semiconductor substrate 404. The plurality of IC die 430a-430e are bonded to an adjacent die by way of a hybrid bonding region 412. Outermost sidewalls of the plurality of IC die 430a-430e and the hybrid bonding region 412 are substantially aligned along a line that is perpendicular to a top surface of a first IC die 430a.

In some embodiments, the topmost die 430e of the multi-dimensional integrated chip die 428 may comprise a semiconductor substrate 404e having surfaces that define a notch 432 along an outermost sidewall of the semiconductor substrate 404e. In some embodiments, an opposing outermost sidewall of the semiconductor substrate 404e is substantially straight (e.g., does not have a notch), so that a lower surface of the semiconductor substrate 404e facing IC die 430d is wider than a top surface of the semiconductor substrate 406e facing away from IC die 430d.

FIGS. 5A-5C and 6A-6C illustrates some embodiments of cross-sectional views of trimmed edges of the multi-dimensional integrated chip structure.

Figure 5A:
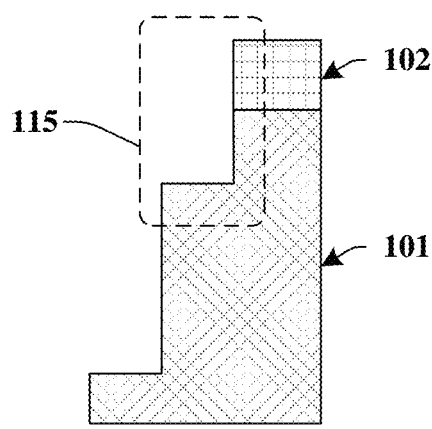
FIGS. 5A-6C illustrate cross-sectional views of some embodiments of trimmed edges of a disclosed multi-dimensional integrated chip structure.
Figure 6A:
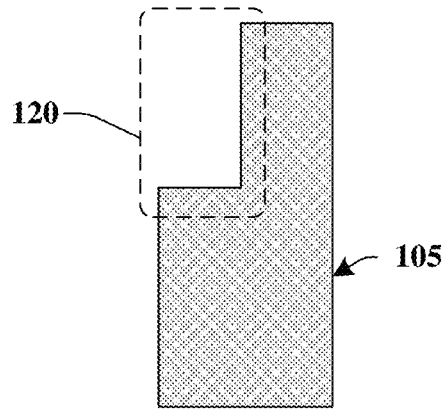
Figure 6B:
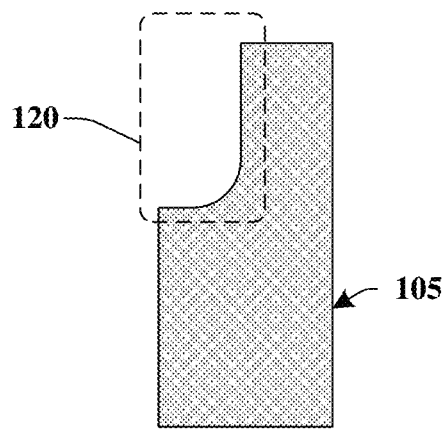

In some embodiments, shown in FIGS. 5A and 6A, the second cut region 115 and the third cut region 120 may be defined by substantially straight edges that meet at a point. In other embodiments, shown in FIGS. 5B and 6B, both the second cut region 115 and the third cut region 120 may be defined by a rounded edge. The rounded edges of the first substrate 101 and the fifth substrate 105 may be coupled to horizontal surfaces of the first substrate 101 and the fifth substrate 105. In some embodiments, a width of the horizontal surface and a corresponding rounded edge may collectively have a width that is greater than or equal to approximately 10 micrometers. By having a width of greater than approximately 10 micrometers, damage (e.g., chipping) to the first substrate 101 and the fifth substrate 105 can be reduced.

Figure 5B:
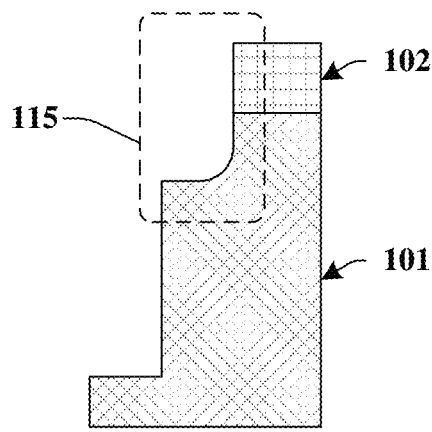
Figure 5C:
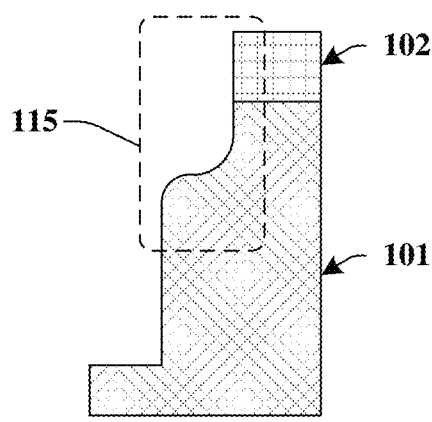
Figure 6C:
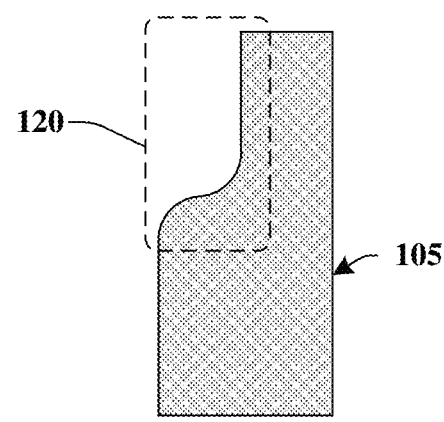

In yet other embodiments, shown in FIGS. 5C and 6C, both the second cut region 115 and the third cut region 120 may be defined by multiple rounded edges. The rounded edges of the first substrate 101 and the fifth substrate 105 may be coupled to opposing ends of horizontal surfaces of the first substrate 101 and the fifth substrate 105. In some embodiments, a width of the horizontal surface and corresponding rounded edges on opposing sides of the horizontal surface may collectively have a width that is greater than or equal to approximately 10 micrometers. By having a width of greater than approximately 10 micrometers, damage (e.g., chipping) to the first substrate 101 and the fifth substrate 105 can be reduced. In yet other embodiments (not shown), the second cut region 115 and the third cut region 120 may be defined by other shapes.

FIGS. 7-10 illustrate cross-sectional views 700-1000 of some embodiments of a method of performing a multi-step edge trimming process on a multi-dimensional integrated chip structure. Although FIGS. 7-10 are described in relation to a method, it will be appreciated that the structures disclosed in FIGS. 7-10 are not limited to such a method, but instead may stand alone as structures independent of the method.

Figure 7:
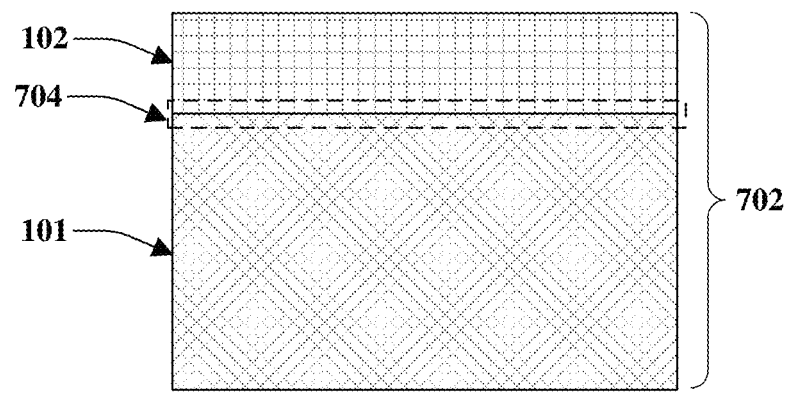
FIGS. 7-10 illustrate some embodiments of a method of performing a multi-step edge trimming process on a multi-dimensional integrated chip structure.

As shown in cross-sectional view 700 of FIG. 7, a multi-dimensional integrated chip structure 702 is formed. The multi-dimensional integrated chip structure 702 may be formed by bonding a plurality of substrates 101-102 together in a stacked configuration. In some embodiments, the multi-dimensional integrated chip structure 702 may comprise a first substrate 101 bonded to a second substrate 102 along a bonding interface 704. In some embodiments, the bonding interface 704 may comprise a hybrid bonding interface, in which a first plurality of conductive bond features contact the second plurality of conductive bond features along a first interface and a first dielectric layer contacts a second dielectric layer along a second interface. In other embodiments, the bonding interface 704 may comprise a dielectric bonding interface, in which a first dielectric layer contacts a second dielectric layer.

Figure 8A:
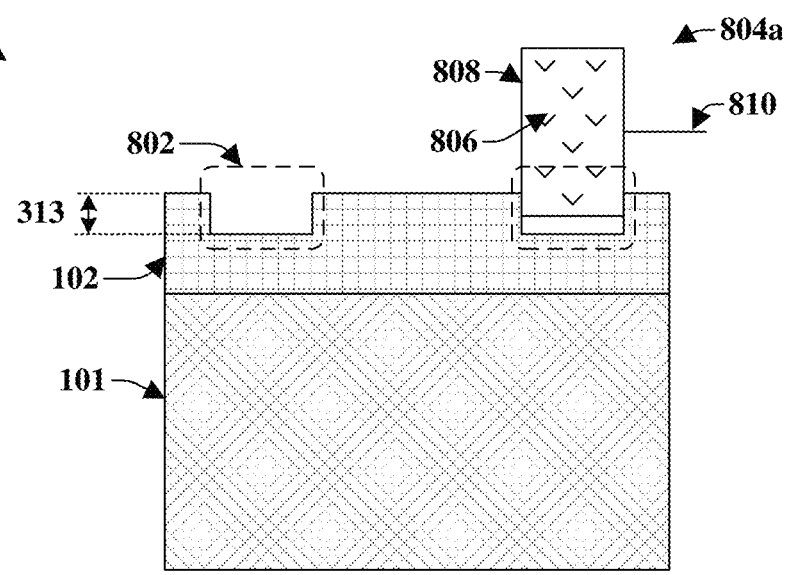

As shown in cross-sectional view 800 of FIG. 8A, a first edge trimming cut is performed into a peripheral portion of the second substrate 102 to a third depth 313. The first edge trimming cut removes parts of the second substrate 102 to define a first intermediate cut region 802 that extends within the second substrate 102. In some embodiments, the first intermediate cut region 802 is defined by a recessed surface coupled to an upper surface by an interior sidewall of the second substrate 102. In some embodiments (shown in FIG. 8A), the first edge trimming cut may be separated from a perimeter of the second substrate 102. In other embodiments (shown in FIG. 8B), the first edge trimming cut may extend along a perimeter of the second substrate 102.

In some embodiments, the first edge trimming cut may be performed by bringing a first blade 804a into contact with the second substrate 102 along a closed loop. The first blade 804a has abrasive elements 806 (e.g., diamond particles) bonded to a core 808 having a circular cross-section. The core 808 is configured to rotate around a first axis 810, as the abrasive elements 806 are brought into contact with the second substrate 102.

Figure 8B:
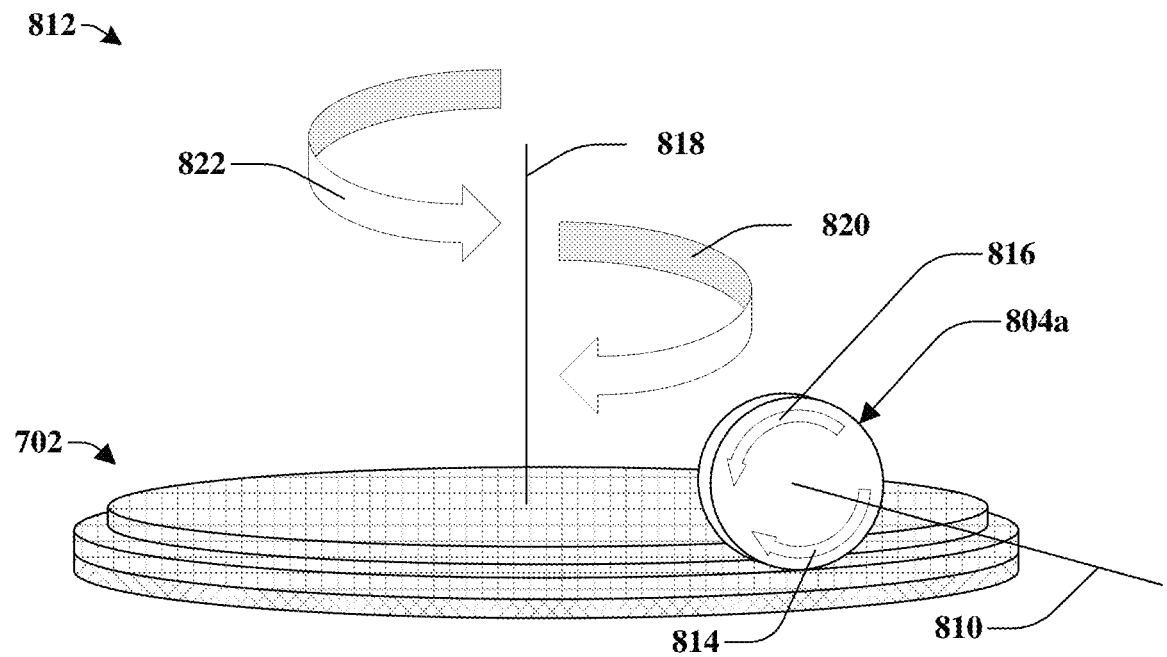

FIG. 8B illustrates a three-dimensional view 812 of the first edge trimming cut. As shown in three-dimensional view 812, the first blade 804a may spin in a first circumferential direction 814 or a second circumferential direction 816 opposite the first circumferential direction 814 around the first axis 810, while the multi-dimensional integrated chip structure 702 is rotated in a third circumferential direction 820 or a fourth circumferential direction 822 opposite the third circumferential direction 820 around a second axis 818. In some embodiments, the method may comprise cutting the multi-dimensional integrated chip structure 702 in a closed and continuous loop around a perimeter of the multi-dimensional integrated chip structure 702.

Figure 9:
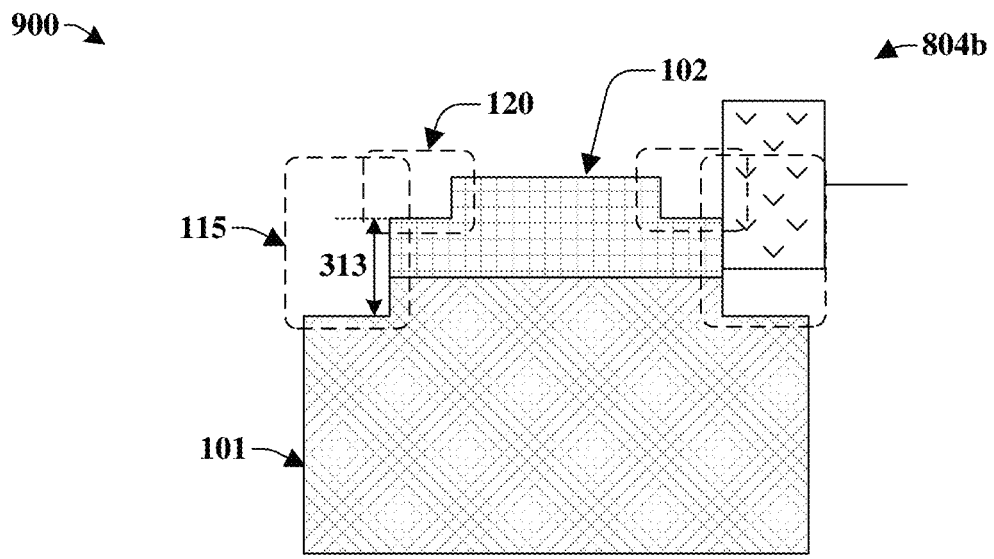

As shown in cross-sectional view 900 of FIG. 9, a second edge trimming cut is performed into a peripheral portion of the first substrate 101 and the second substrate 102 to the second depth 312. The second edge trimming cut defines a third cut region 120 and a second cut region 115 that extends into the first substrate 101. The third cut region 120 has a depth that is less than a thickness of the second substrate 102, so that the third cut region 120 is defined by a sidewall and a lower surface of the second substrate 102. In some embodiments, the third cut region 120 may extend through between approximately 40% and approximately 60% of the second substrate 102, between approximately 25% and approximately 85% of the second substrate 102, or other suitable ranges. For example, in some embodiments, the second substrate 102 may have a thickness of between approximately 20 micrometers and approximately 100 micrometers, while the third cut region 120 may extend within the second substrate 102 to a depth of between approximately 5 micrometers and approximately 75 micrometers. In various embodiments, the third cut region 120 may have a width of greater than 10 micrometers, greater than 100 micrometers, or other suitable values.

The second cut region 115 has a depth that is greater than the second substrate 102, so that the second cut region 115 is defined by a lower surface of the first substrate 101 and sidewalls of both the first substrate 101 and the second substrate 102. In some embodiments, the second cut region 115 may extend through between approximately 15% and approximately 45% of the first substrate 101, between approximately 10% and approximately 30% of the first substrate 101, or other suitable ranges. In various embodiments, the second cut region 115 may have a depth that is between approximately 30 micrometers and approximately 250 micrometers, between approximately 50 micrometers and approximately 400 micrometers, or other suitable values. In various embodiments, the second cut region 115 may have a width of greater than 10 micrometers, greater than 100 micrometers, or other suitable values.

In some embodiments, the second edge trimming cut may be performed by bringing a second blade 804b into contact with the first substrate 101 and the second substrate 102 along a closed loop. In some embodiments, the first blade 804a may be a same blade as the second blade 804b. In other embodiments, the first blade 804a and the second blade 804b may comprise different blades. In some embodiments, the first blade 804a and the second blade 804b may have different widths.

Figure 10:
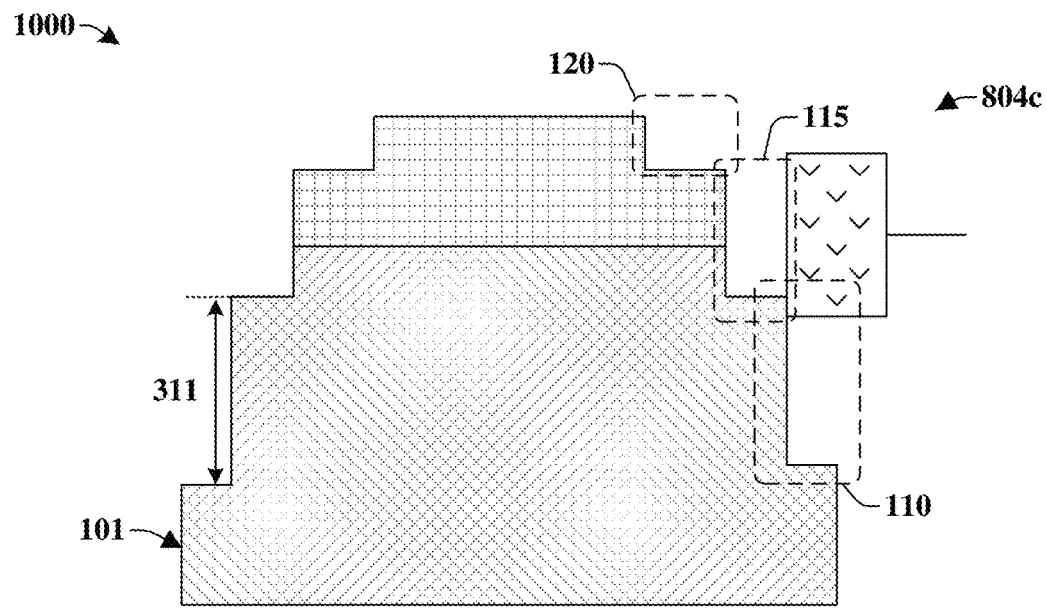

As shown in cross-sectional view 1000 of FIG. 10, a third edge trimming cut is performed into a peripheral portion of the first substrate 101 to the first depth 311. The third edge trimming cut removes parts of the first substrate 101 along a perimeter of the first substrate 101. By removing parts of the first substrate 101, the third edge trimming cut defines a first cut region 110. The first cut region 110 has a depth that is less than the first substrate 101, so that the first cut region 110 is defined by a lower surface of the first substrate 101 and a sidewall of the first substrate 101. In some embodiments, the first cut region 110 may extend through between approximately 40% and approximately 60% of the first substrate 101, between approximately 45% and approximately 55% of the first substrate 101, or other suitable ranges. In various embodiments, the first cut region 110 may have a depth that is between approximately 50 micrometers and approximately 500 micrometers, between approximately 150 micrometers and approximately 350 micrometers, or other suitable values. In various embodiments, the first cut region 110 may have a width that is between approximately 10 micrometers and approximately 5 mm.

In some embodiments, the third edge trimming cut may be performed by bringing a third blade 804c into contact with the first substrate 101 along a closed loop. In some embodiments, the third blade 804c may be a same blade as the first blade 804a and/or the second blade 804b. In other embodiments, the third blade 804c may be a different blade than the first blade 804a and/or the second blade 804b. In some embodiments, the third blade 804c may have a different width than the first blade 804a and/or the second blade 804b.

It will be appreciated that the first edge trimming cut, the second edge trimming cut, and the third edge trimming cut may comprise different types of trim processes that exert different stresses on different parts of the multi-dimensional integrated chip structure 702. For example, in some embodiments, the first edge trimming cut may comprise a first type of trim process that exerts a first shear stress onto a sidewall of the multi-dimensional integrated chip structure 702 and a first pressure onto underlying surfaces, while the second edge trimming cut may comprise a second type of trim process that exerts a smaller second shear stress onto a sidewall of the multi-dimensional integrated chip structure 702 and a larger second pressure onto underlying surfaces. By having different edge trimming cuts exert different stresses on different parts of the multi-dimensional integrated chip structure 702, damage to the multi-dimensional integrated chip structure 702 can be mitigated.

Figure 11A:
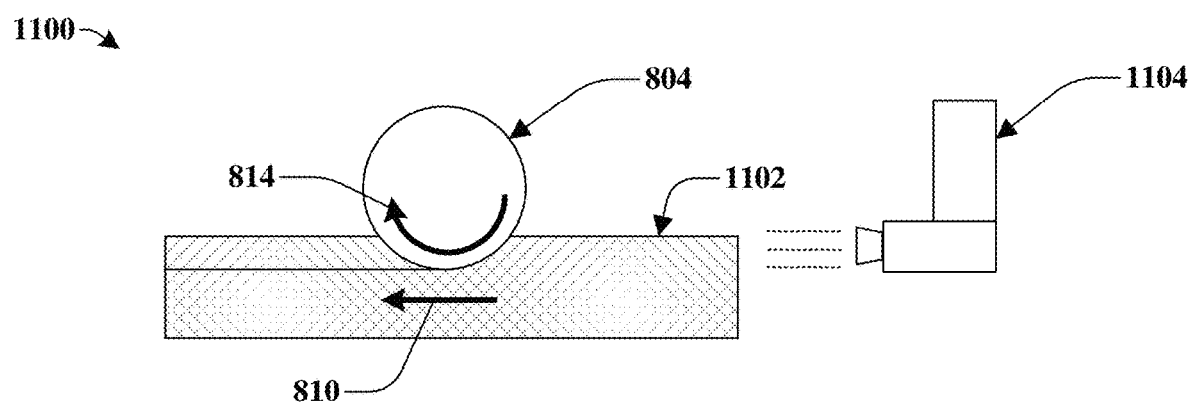
FIGS. 11A-11B illustrate some embodiments of different types of edge trimming steps.

In some embodiments, the different types of edge trimming cuts may comprise an "up-cut" and a "down-cut". FIG. 11A illustrates a cross-sectional view 1100 showing a first type of edge trimming cut comprising a "down-cut". The down-cut comprises spinning a blade 804 in the first circumferential direction 814 and spinning a substrate 1102 in the third circumferential direction 820. The down-cut further comprises bringing the spinning blade 804 into contact with the substrate 1102 such that the blade 804 and the substrate 1102 travel in the same direction at a point of contact between the blade 804 and the substrate 1102. In some embodiments, the down-cut further comprises using a shower 1104 to wash away debris from the substrate 1102 and the blade 804 during the edge trimming cut. The down-cut has a smaller shear stress and a larger pressure than the up-cut.

Figures 11B, 12:
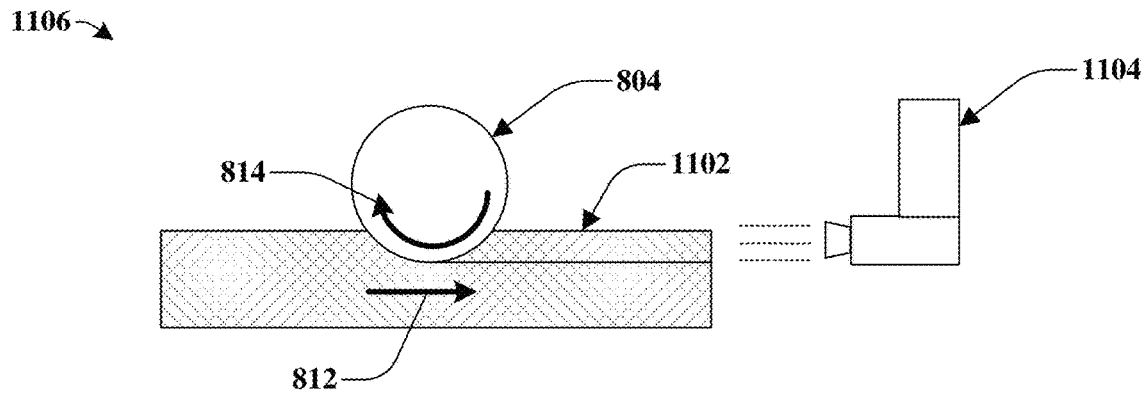
FIG. 12 illustrates a table listing some embodiments of different processes that may be used for implementing the method illustrated in FIGS. 7-10.

FIG. 11B illustrates a cross-sectional view showing the second type of edge trimming cut comprising an "up-cut". The up-cut comprises spinning the blade 804 in the first circumferential direction 814 and spinning the substrate 1102 in the fourth circumferential direction 822. The up-cut further comprises bringing the spinning blade 804 into contact with the spinning substrate 1102 such that the blade 804 and the substrate 1102 travel in opposite directions at a point of contact between the blade 804 and the substrate 1102. In some embodiments, the up-cut also comprises using a shower 1104 to wash away debris from the substrate 1102 and the blade 804 during the trimming. The up-cut has a larger shear stress and a smaller pressure than the down-cut.

FIG. 12 illustrates a table 1200 comprising some embodiments of different multi-step edge trimming processes A-H that may be used for implementing the method illustrated in FIGS. 7-10. Multi-step process F, for example, may include performing a down-cut for the first edge trimming cut, performing an up-cut for the second edge trimming cut, and performing a down-cut for the third edge trimming cut. Any of the multi-step processes A-H may be used in the method illustrated in FIGS. 7-10.

FIGS. 13-37 illustrate a series of cross-sectional views 1300-3700 of some embodiments of a method of forming a multi-dimensional integrated chip structure. Although FIGS. 13-37 are described in relation to a method, it will be appreciated that the structures disclosed in FIGS. 13-37 are not limited to such a method, but instead may stand alone as structures independent of the method.

Figure 13:
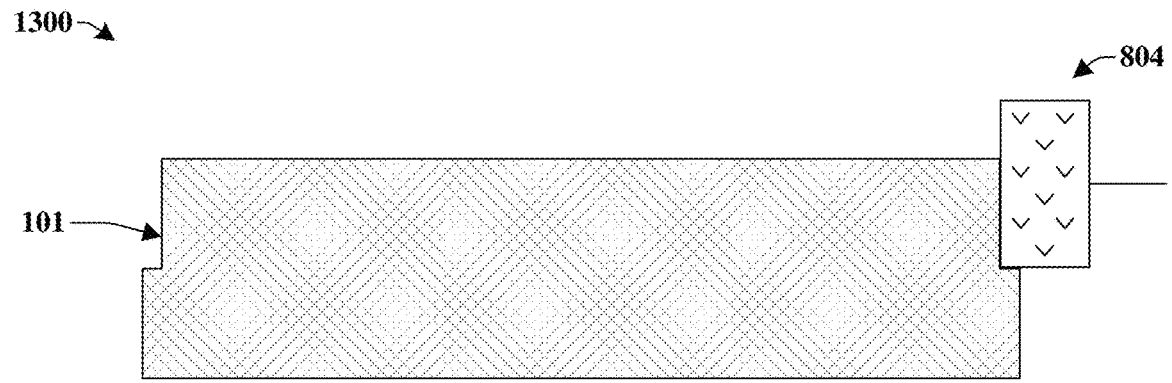
FIGS. 13-37 illustrate cross-sectional views of some embodiments of a method of forming a multi-dimensional integrated chip structure.

As shown in cross-sectional view 1300 of FIG. 13, a first edge trimming cut is performed to remove material along the outer perimeter of a first substrate 101. In some embodiments, the first edge trimming cut may be performed by bringing a blade 804 into contact with the first substrate 101 along a first closed loop extending along the outer perimeter of the first substrate 101. In various embodiments, the first edge trimming cut may comprise a first type of edge trimming cut (e.g., an up-cut) or a second type of edge trimming cut (e.g., a down-cut).

Figure 14:
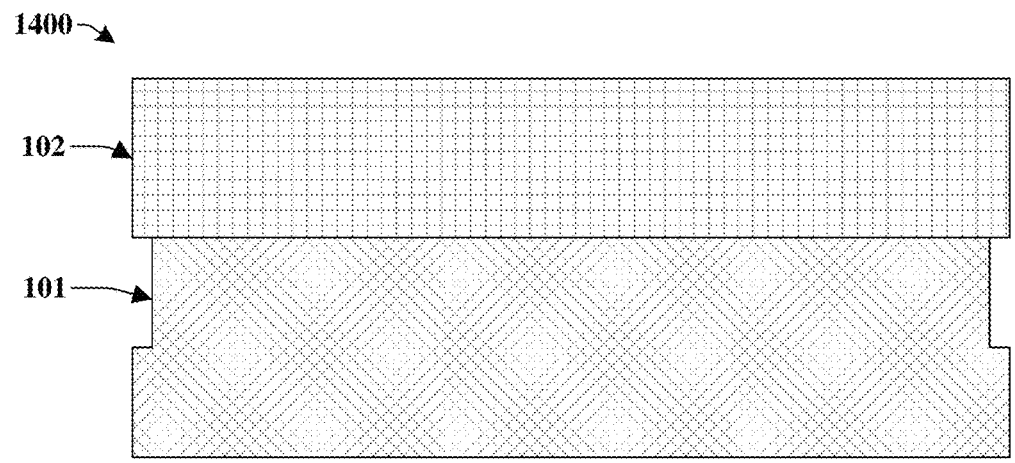

As shown in cross-sectional view 1400 of FIG. 14, a second substrate 102 is bonded to the first substrate 101. In various embodiments, the second substrate 102 may be bonded to the first substrate 101 by way of a hybrid bonding process, or by way of a dielectric bonding process, to form a first bonding region between the first substrate 101 and the second substrate 102.

Figure 15:
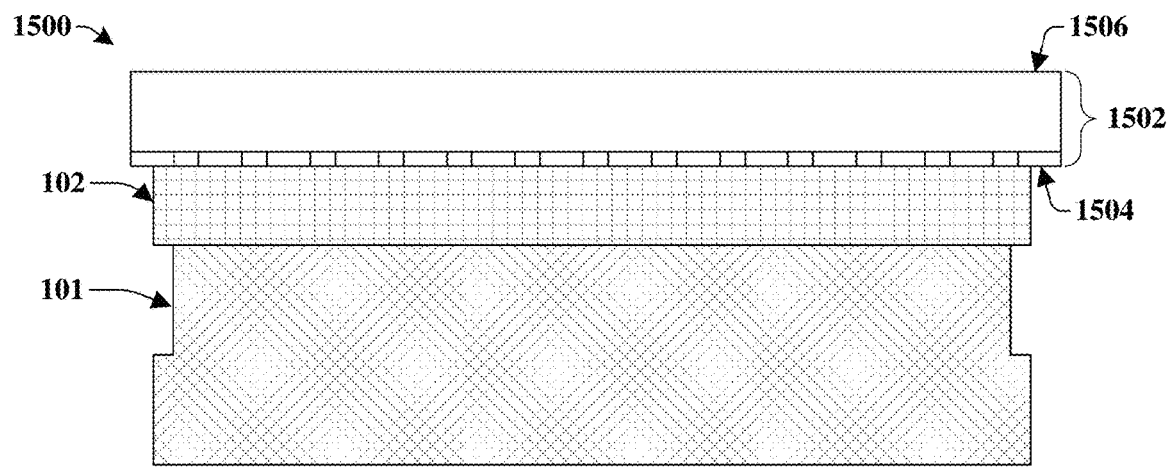

As shown in cross-sectional view 1500 of FIG. 15, a first grinding process is performed on the second substrate 102 to reduce the thickness of the second substrate 102. In some embodiments, the first grinding process comprises a coarse grinding process configured to reduce a thickness of the second substrate 102 from a first thickness to a second thickness. In some embodiments, the first thickness may be in a first range of between approximately 595 μm and approximately 950 μm, between approximately 700 μm and 800 μm, between approximately 750 μm and approximately 800 μm, or other suitable values. In some embodiments, the first thickness may be reduced by approximately 575 μm and approximately 750 μm, between approximately 500 μm and approximately 750 μm, or other suitable values. In some embodiments, the second thickness may be in a second range of between approximately 50 μm and approximately 250 μm, between approximately 100 μm and approximately 200 μm, or other suitable values. In some embodiments, the first grinding process may comprise a first mechanical grinding process that achieves a first surface roughness. In some embodiments, the first grinding process may comprise bringing a grinding wheel 1502 into contact with a back-side of the second substrate 102. In some embodiments, the grinding wheel 1502 may comprise a plurality of abrasive elements 1504 disposed onto a base 1506. In some embodiments, the base 1506 may comprise a ring shaped structure as viewed from a top of the base 1506.

Figure 16:
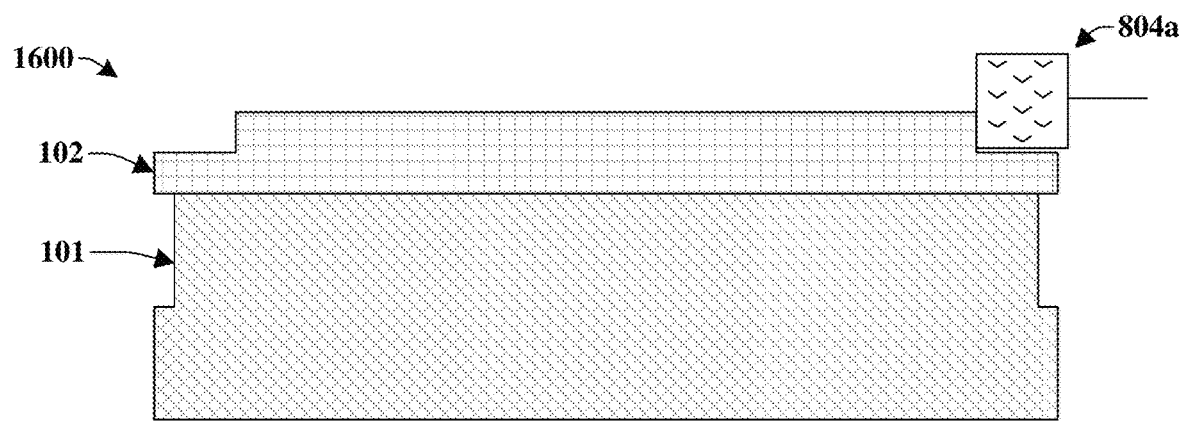

As shown in cross-sectional view 1600 of FIG. 16, a second edge trimming cut is performed into a peripheral portion the second substrate 102. In some embodiments, the second edge trimming cut may be performed by bringing a first blade 804a into contact with the second substrate 102 along a closed loop. The second edge trimming cut may comprise the first type of edge trimming cut or the second type of edge trimming cut.

Figure 17:
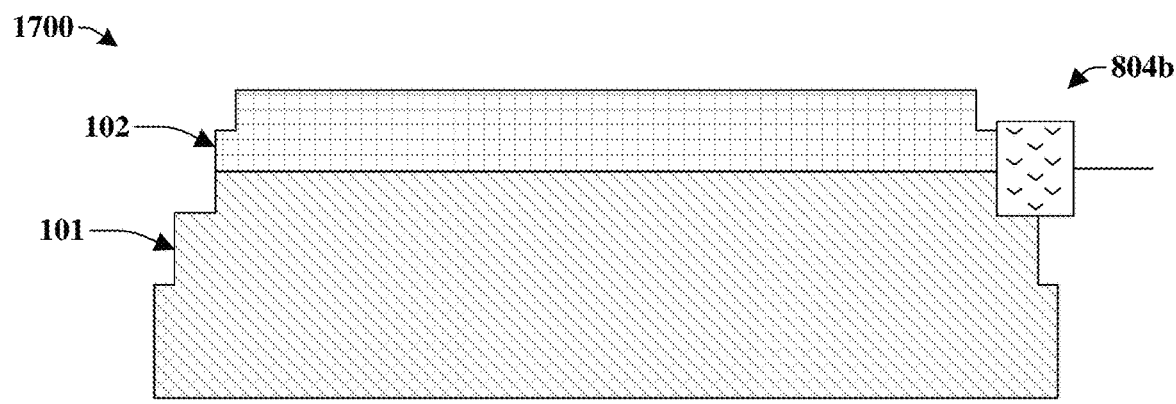

As shown in cross-sectional view 1700 of FIG. 17, a third edge trimming cut is performed into a peripheral portion of the second substrate 102 and into a peripheral portion of the first substrate 101. In some embodiments, the third edge trimming cut may be performed by bringing a second blade 804b into contact with the second substrate 102 and the first substrate 101 along a closed loop. The third edge trimming cut may comprise the first type of edge trimming cut or the second type of edge trimming cut. In some embodiments, the second edge trimming cut may be a different type of edge trimming cut than the third edge trimming cut. For example, in some embodiments, the second edge trimming cut may be an up cut while the third edge trimming cut may be a down-cut. In other embodiments, the second edge trimming cut may be a same type of edge trimming cut as the third edge trimming cut.

Figure 18:
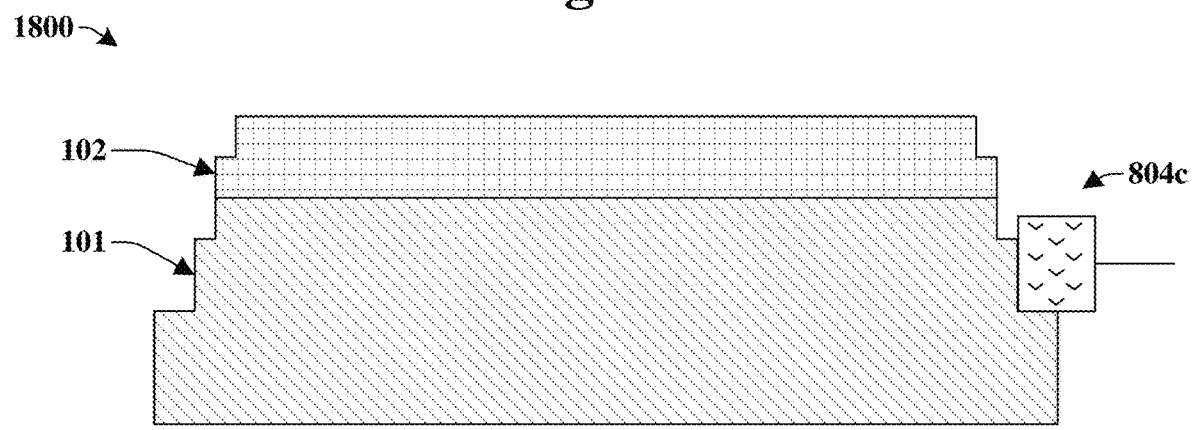

As shown in cross-sectional view 1800 of FIG. 18, a fourth edge trimming cut is performed into a peripheral portion of the first substrate 101. In some embodiments, the fourth edge trimming cut may be performed by bringing a third blade 804c into contact with the first substrate 101 along a closed loop. The fourth edge trimming cut may comprise the first type of edge trimming cut or the second type of edge trimming cut. In some embodiments, the fourth edge trimming cut may be a different type of edge trimming cut than the third edge trimming cut. For example, in some embodiments, the fourth edge trimming cut may be an up-cut while the third edge trimming cut may be a down-cut. In other embodiments, the fourth edge trimming cut may be a same type of edge trimming cut than the third edge trimming cut.

Figure 19:
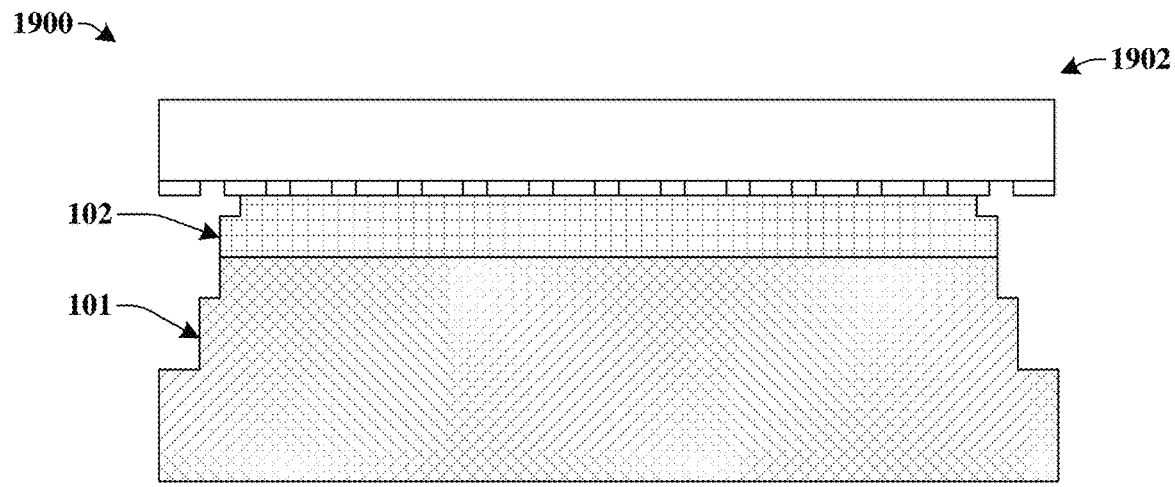

As shown in cross-sectional view 1900 of FIG. 19, a second grinding process and a third grinding process may be performed on the second substrate 102 to further reduce the thickness of the second substrate 102 and to smooth an upper surface (e.g., a back-side) of the second substrate 102. In some embodiments, the second grinding process may comprise a fine grinding process performed by a grinding wheel 1902 and configured to reduce a thickness of the second substrate 102 from the second thickness to a third thickness. In some embodiments, the second grinding process may comprise a second mechanical grinding process that achieves a second surface roughness that is less than the first surface roughness. In some embodiments, the third grinding process may comprise a chemical mechanical planarization (CMP) process configured to reduce a thickness of the second substrate from the second thickness to a third thickness. In some embodiments, the second thickness may be reduced by approximately 3 µm, by between approximately 5 µm and approximately 10 µm, or other suitable values. In some embodiments, the third thickness may be in a range of between approximately 3 µm and approximately 10 µm, between approximately 20 µm and approximately 40 µm, between approximately 10 µm and approximately 200 µm, or other suitable values.

Figure 20:
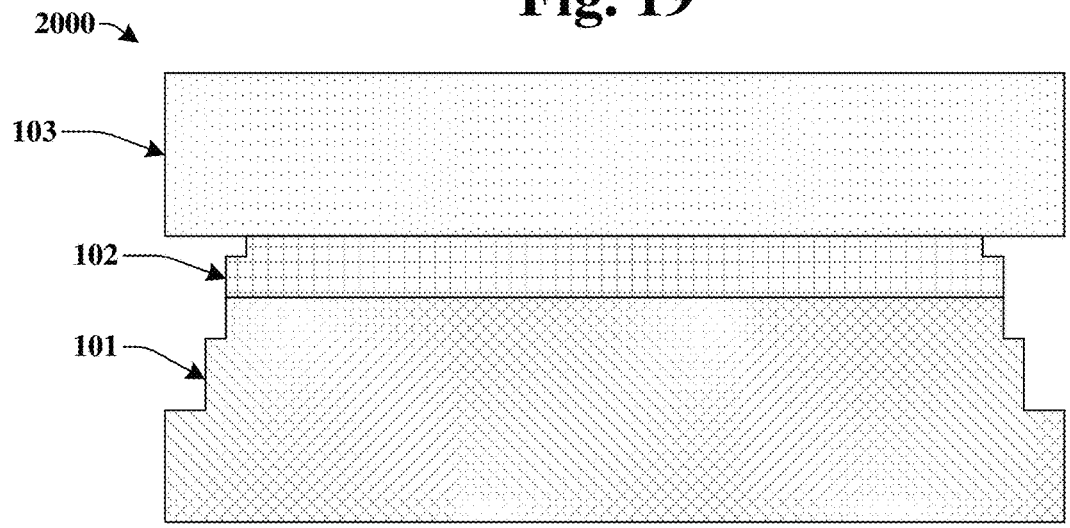

As shown in cross-sectional view 2000 of FIG. 20, a lower surface of a third substrate 103 is bonded to the upper surface of the second substrate 102. In various embodiments, the third substrate 103 may be bonded to the second substrate 102 by way of a hybrid bonding process, or by way of a dielectric bonding process, to form a second bonding region between the second substrate 102 and the third substrate 103.

Figure 21:
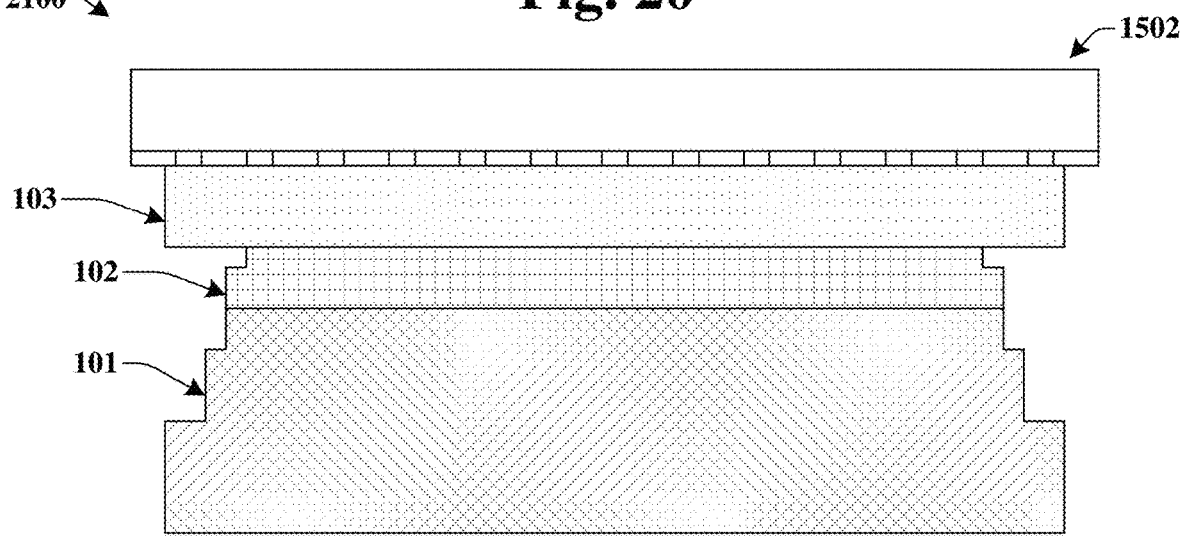

As shown in cross-sectional view 2100 of FIG. 21, a fourth grinding process 1106 is performed on the third substrate 103 to reduce the thickness of the third substrate 103. In some embodiments, the fourth grinding process may comprise a coarse grinding process that is performed by bringing a grinding wheel 1502 into contact with the third substrate 103.

Figure 22:
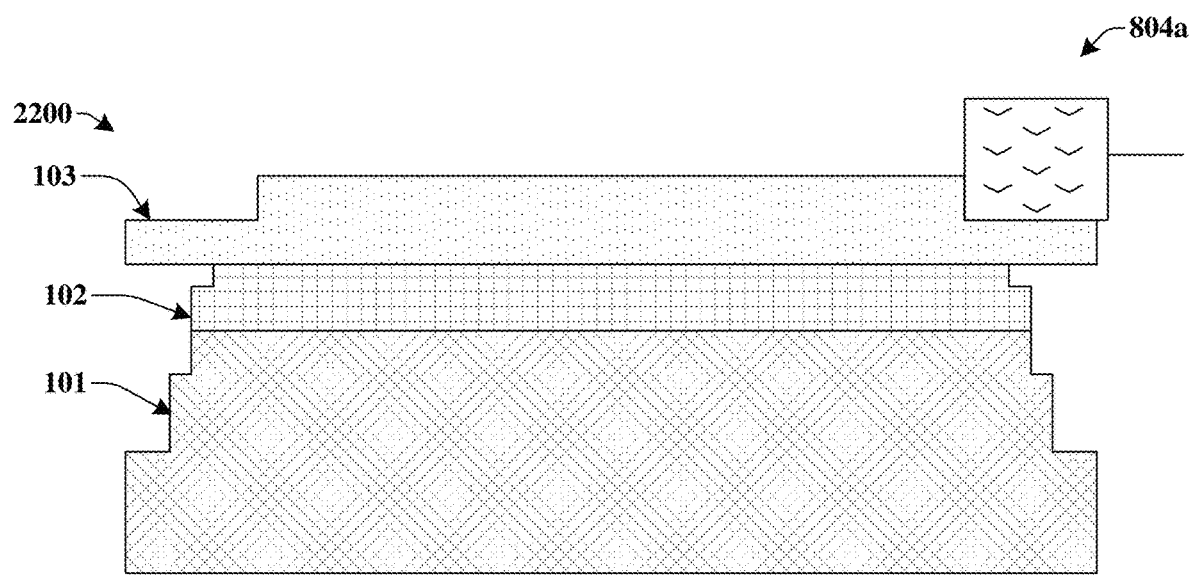

As shown in cross-sectional view 2200 of FIG. 22, a fifth edge trimming cut is performed into a peripheral portion of the third substrate 103. The fifth edge trimming cut may comprise the first type of edge trimming cut or the second type of edge trimming cut. In some embodiments, the second edge trimming cut may be performed by bringing a first blade 804a into contact with the third substrate 103 along a closed loop.

Figure 23:
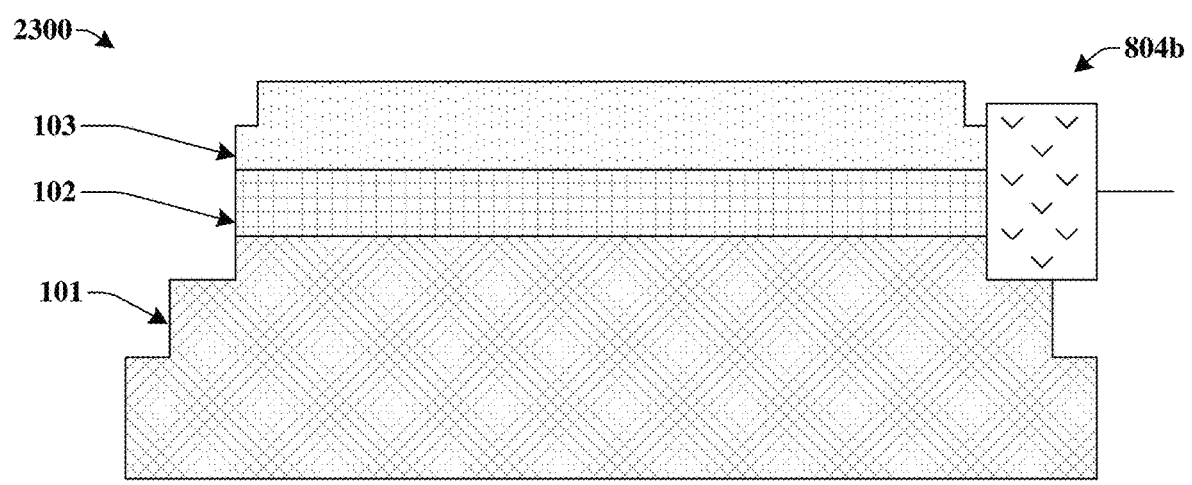

As shown in cross-sectional view 2300 of FIG. 23, a sixth edge trimming cut is performed into a peripheral portion of the third substrate 103, into a peripheral portion of the second substrate 102, and into a peripheral portion of the first substrate 101. In some embodiments, the sixth edge trimming cut may be performed by bringing a second blade 804b into contact with the third substrate, the second substrate 102, and the first substrate 101 along a closed loop. The sixth edge trimming cut may comprise the first type of edge trimming cut or the second type of edge trimming cut.

Figure 24:
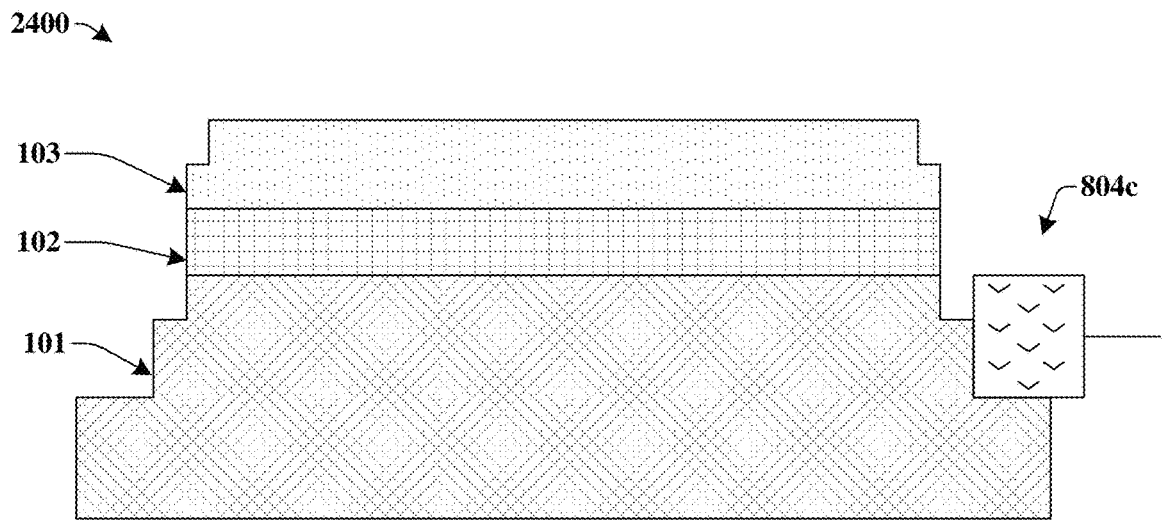

As shown in cross-sectional view 2400 of FIG. 24, a seventh edge trimming cut is performed into a peripheral portion of the first substrate 101. In some embodiments, the seventh edge trimming cut may be performed by bringing a third blade 804c into contact with the first substrate 101 along a closed loop. The seventh edge trimming cut may comprise the first type of trimming edge trimming cut or the second type of edge trimming cut.

Figure 25:
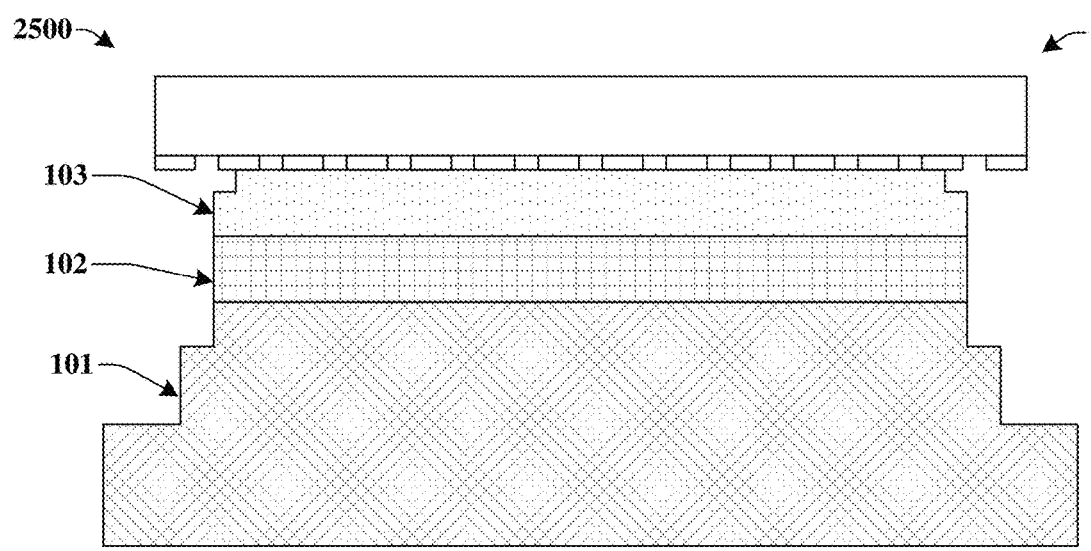

As shown in cross-sectional view 2500 of FIG. 25, a fifth grinding process and a sixth grinding process are performed on the third substrate 103 to reduce the thickness of the third substrate 103 and to smooth an upper surface (e.g., a back-side) of the third substrate 103. In some embodiments, the fifth grinding process may comprise a fine grinding process performed by a grinding wheel 1902 and the sixth grinding process may comprise a CMP process.

Figure 26:
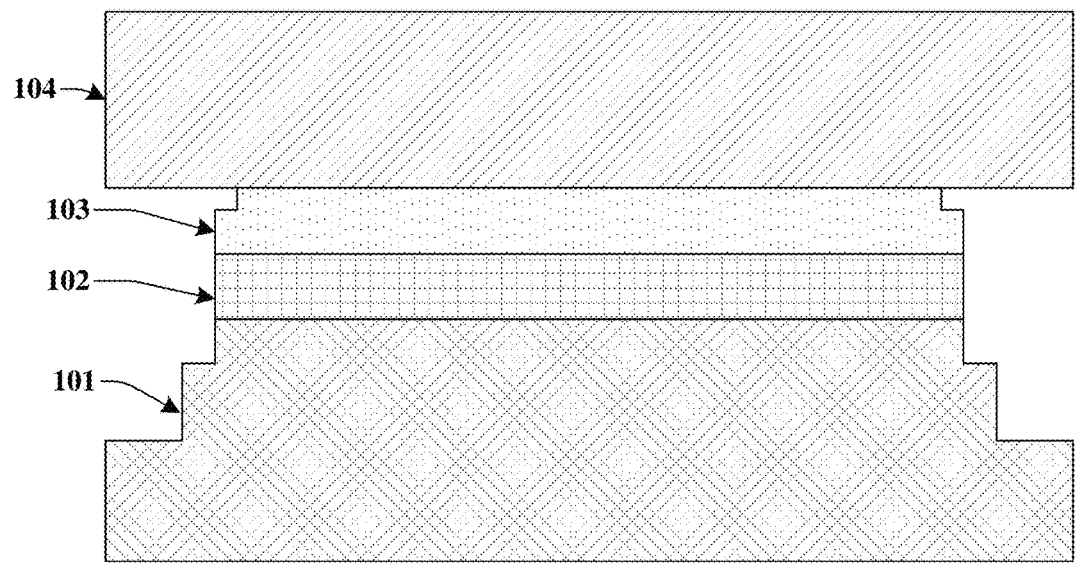

As shown in cross-sectional view 2600 of FIG. 26, a lower surface of a fourth substrate 104 is bonded to the upper surface of the third substrate 103. In various embodiments, the fourth substrate 104 may be bonded to the third substrate 103 by way of a hybrid bonding process, or by way of a dielectric bonding process, to form a third bonding region between the third substrate 103 and the fourth substrate 104.

Figure 27:
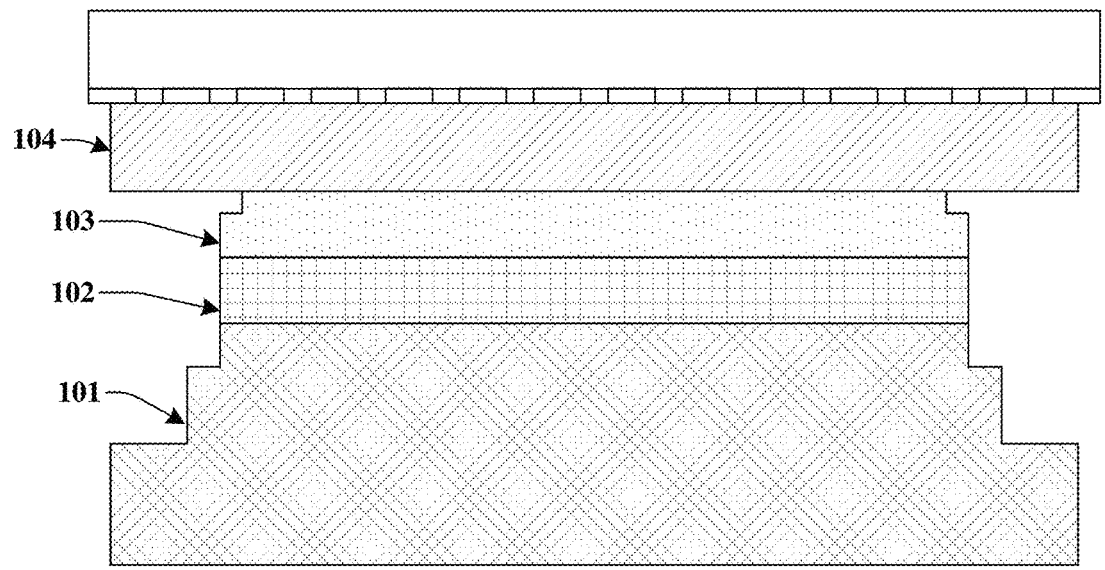

As shown in cross-sectional view 2700 of FIG. 27, a seventh grinding process is performed on the fourth substrate 104 to reduce the thickness of the fourth substrate 104. In some embodiments, the seventh grinding process may comprise a coarse grinding process that is performed by bringing a grinding wheel 1502 into contact with the fourth substrate 104.

Figure 28:
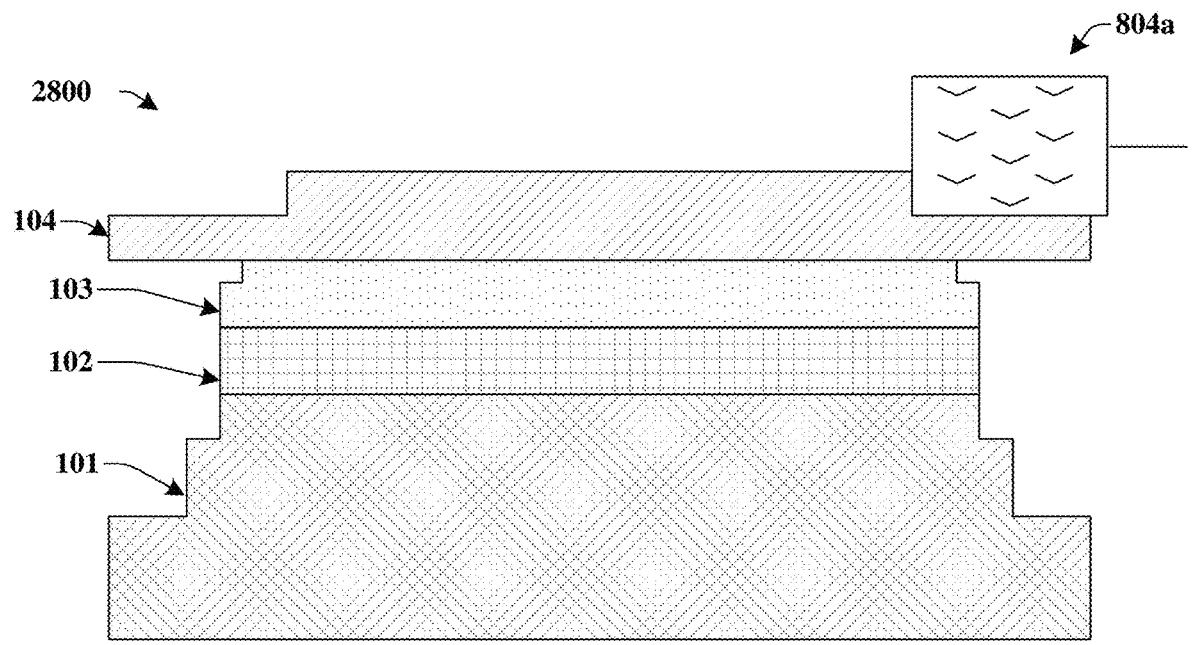

As shown in cross-sectional view 2800 of FIG. 28, an eighth edge trimming cut is performed into a peripheral portion of the fourth substrate 104. In some embodiments, the second edge trimming cut may be performed by bringing a first blade 804a into contact with the fourth substrate 104 along a closed loop. The eighth edge trimming cut may comprise the first type of edge trimming cut or the second type of edge trimming cut.

Figure 29:
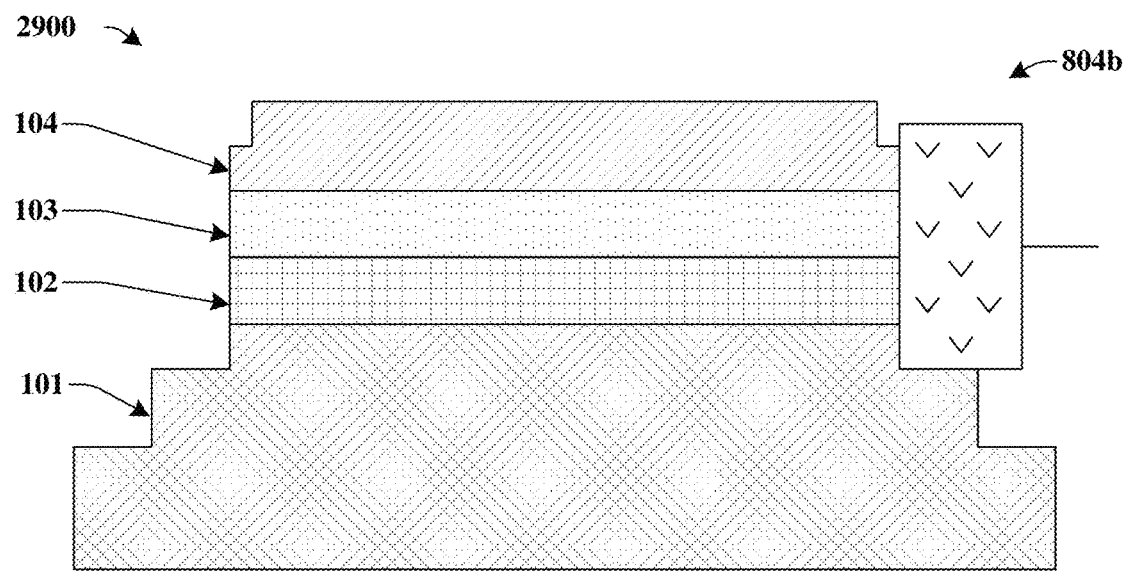

As shown in cross-sectional view 2900 of FIG. 29, a ninth edge trimming cut is performed into a peripheral portion of the fourth substrate 104, into a peripheral portion of the third substrate 103, into a peripheral portion of the second substrate 102, and into a peripheral portion of the first substrate 101. In some embodiments, the ninth edge trimming cut may be performed by bringing a second blade 804b into contact with the fourth substrate 104, the third substrate 103, the second substrate 102, and the first substrate 101 along a closed loop. The ninth edge trimming cut may comprise the first type of edge trimming cut or the second type of edge trimming cut.

Figure 30:
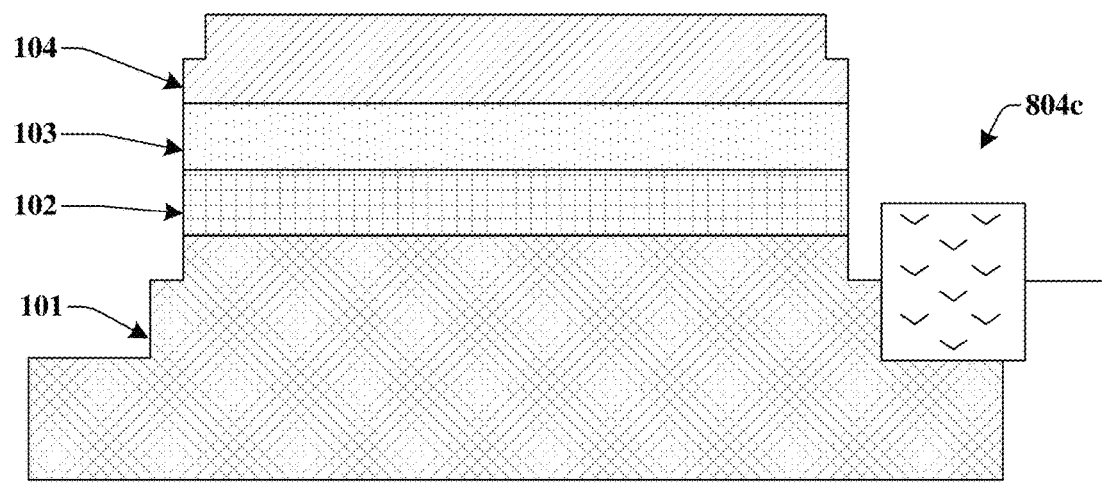

As shown in cross-sectional view 3000 of FIG. 30, a tenth edge trimming cut is performed into a peripheral portion of the first substrate 101. In some embodiments, the tenth edge trimming cut may be performed by bringing a third blade 804c into contact with the first substrate 101 along a closed loop. The tenth edge trimming cut may comprise the first type of edge trimming cut or the second type of edge trimming cut.

Figure 31:
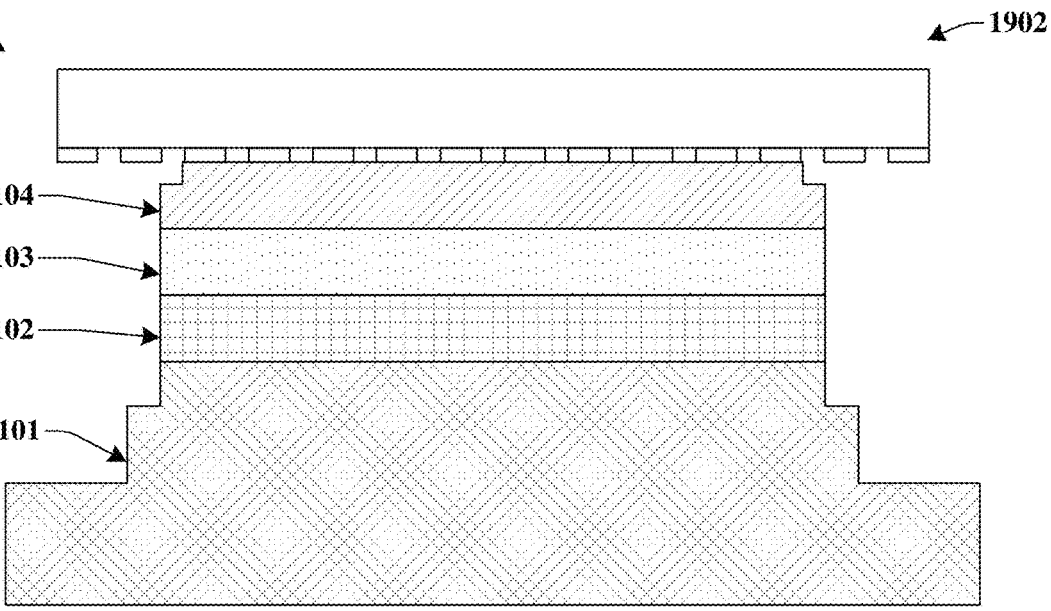

As shown in cross-sectional view 3100 of FIG. 31, an eighth grinding process and a ninth grinding process are performed on the fourth substrate 104 to reduce the thickness of the fourth substrate 104 and to smooth an upper surface (e.g., a back-side) of the fourth substrate 104. In some embodiments, the eighth grinding process may comprise a fine grinding process performed by a grinding wheel 1902 and the ninth grinding process may comprise a CMP process.

Figure 32:
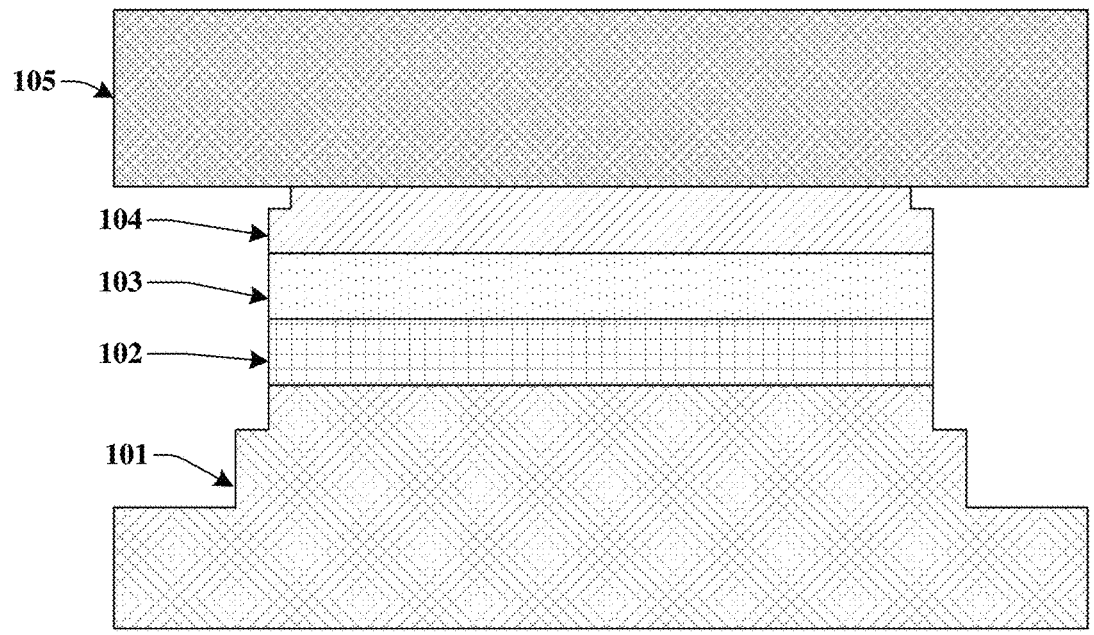

As shown in cross-sectional view 3200 of FIG. 32, a lower surface of a fifth substrate 105 is bonded to the upper surface of the fourth substrate 104. In various embodiments, the fifth substrate 105 may be bonded to the fourth substrate 104 by way of a hybrid bonding process, or by way of a dielectric bonding process, to form a fourth bonding region between the fourth substrate 104 and the fifth substrate 105.

Figure 33:
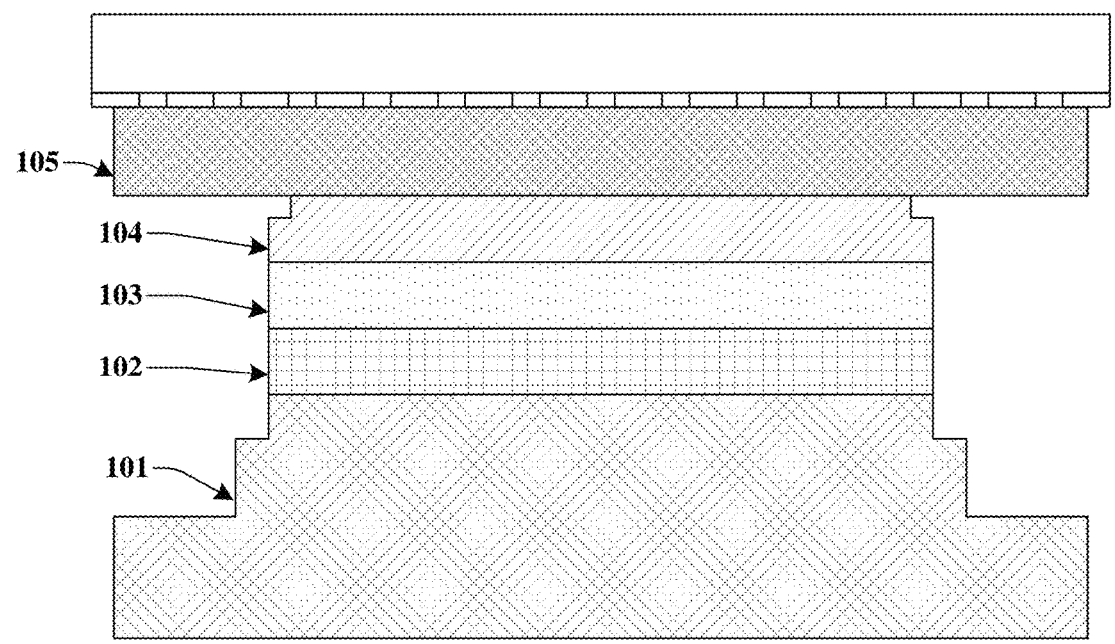

As shown in cross-sectional view 3300 of FIG. 33, a ninth grinding process is performed on the fifth substrate 105 to reduce the thickness of the fifth substrate 105. In some embodiments, the ninth grinding process may comprise a coarse grinding process that is performed by bringing a grinding wheel 1502 into contact with the fifth substrate 105.

Figure 34:
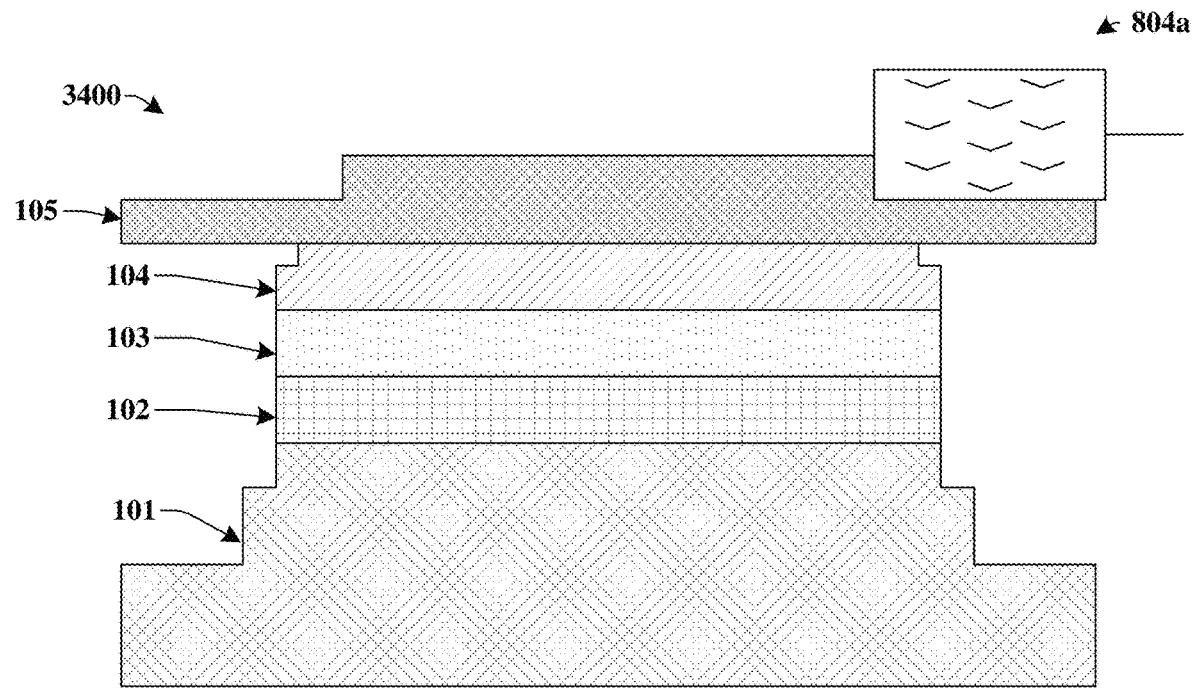

As shown in cross-sectional view 3400 of FIG. 34, an eleventh edge trimming cut is performed into a peripheral portion of the fifth substrate 105. In some embodiments, the eleventh edge trimming cut may be performed by bringing a first blade 804*a* into contact with the fifth substrate 105 along a closed loop. The eleventh edge trimming cut may comprise the first type of edge trimming cut or the second type of edge trimming cut.

Figure 35:
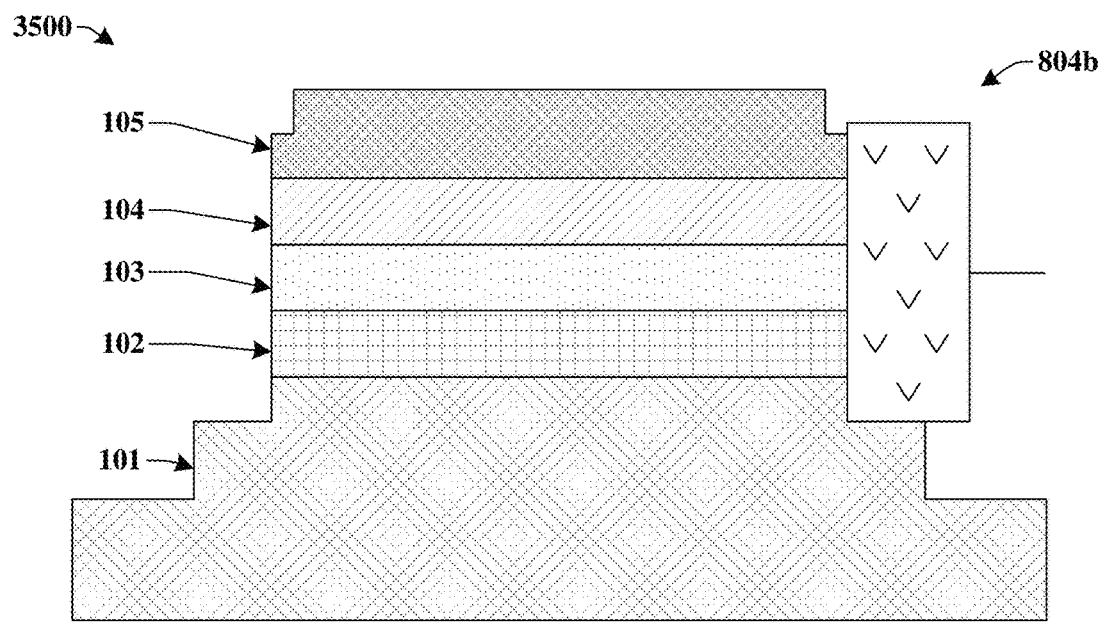

As shown in cross-sectional view 3500 of FIG. 35, a twelfth edge trimming cut is performed into a peripheral portion of the fifth substrate 105, into a peripheral portion of the fourth substrate 104, into a peripheral portion of the third substrate 103, into a peripheral portion of the second substrate 102, and into a peripheral portion of the first substrate 101. In some embodiments, the twelfth edge trimming cut may be performed by bringing a second blade 804*b* into contact with the fifth substrate 105, the fourth substrate 104, the third substrate 103, the second substrate 102, and the first substrate 101 along a closed loop. The twelfth edge trimming cut may comprise the first type of edge trimming cut or the second type of edge trimming cut.

Figure 36:
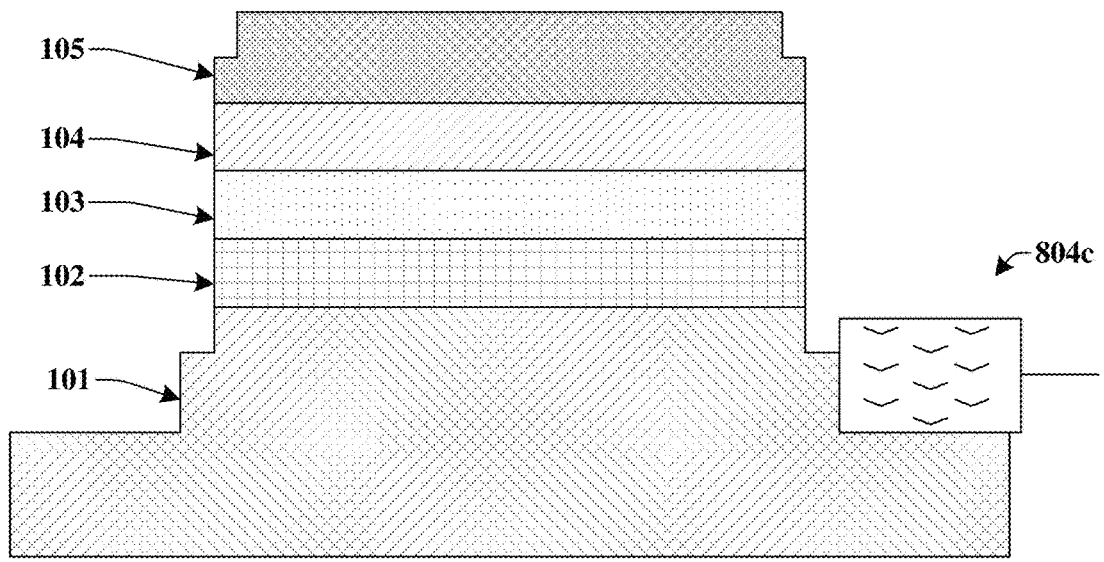

As shown in cross-sectional view 3600 of FIG. 36, a thirteenth edge trimming cut is performed into a peripheral portion of the first substrate 101. In some embodiments, the thirteenth edge trimming cut may be performed by bringing a third blade 804*c* into contact with the first substrate 101 along a closed loop. The thirteenth edge trimming cut may comprise the first type of edge trimming cut or the second type of edge trimming cut.

Figure 37:
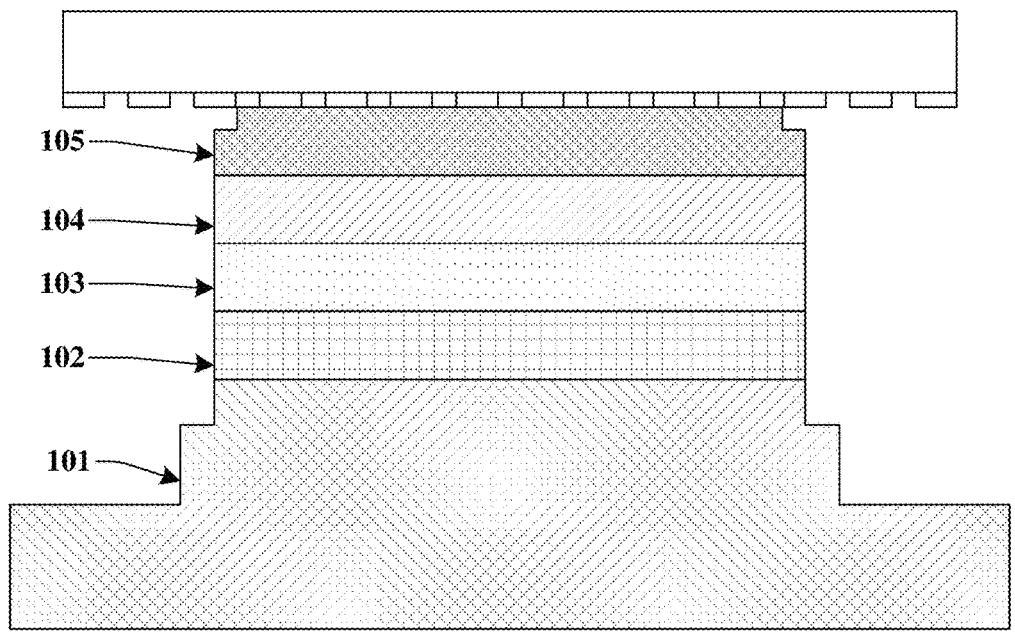

As shown in cross-sectional view 3700 of FIG. 37, a tenth grinding process and an eleventh grinding process are performed on the fifth substrate 105 to reduce the thickness of the fifth substrate 105 and to smooth an upper surface of the fifth substrate 105. In some embodiments, the tenth grinding process may comprise a fine grinding process performed by a grinding wheel 1902 and the eleventh grinding process may comprise a CMP process.

Figure 38:
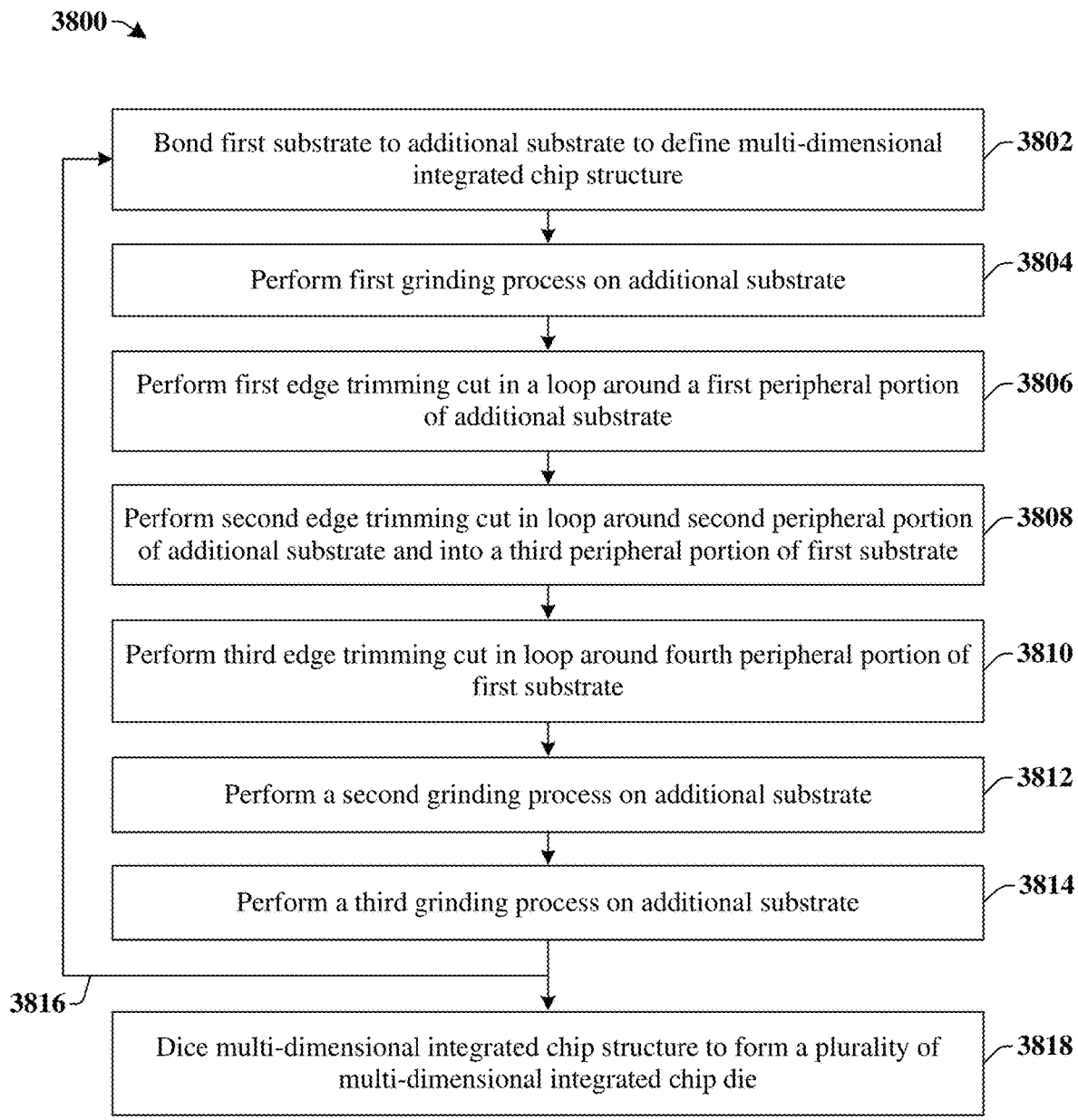
FIG. 38 illustrates a flowchart of some embodiments of a method of forming a multi-dimensional integrated chip structure.

FIG. 38 illustrates a flowchart of some embodiments of a method 3800 for forming the multi-dimensional integrated chip structure.

At 3802, a first substrate is bonded to an additional substrate to form multi-dimensional integrated chip structure. FIG. 14 illustrates a cross-sectional view 1400 of some embodiments corresponding to act 3802.

At 3804, a first grinding process is performed on the additional substrate. FIG. 15 illustrates a cross-sectional view 1500 of some embodiments corresponding to act 3804.

At 3806, a first edge trimming cut is performed in a loop around a first peripheral portion of the additional substrate. FIG. 16 illustrates a cross-sectional view 1600 of some embodiments corresponding to act 3806.

At 3808, a second edge trimming cut is performed in a loop around a second peripheral portion of the additional substrate and into a third peripheral portion of the first substrate. FIG. 17 illustrates a cross-sectional view 1700 of some embodiments corresponding to act 3808.

At 3810, a third edge trimming cut is performed in a loop around a fourth peripheral portion of the first substrate. FIG. 18 illustrates a cross-sectional view 1800 of some embodiments corresponding to act 3810.

At 3812, a second grinding process is performed on the additional substrate. FIG. 19 illustrates a cross-sectional view 1900 of some embodiments corresponding to act 3812.

At 3814, a third grinding process is performed on the additional substrate. FIG. 19 illustrates a cross-sectional view 1900 of some embodiments corresponding to act 3814.

In some embodiments, acts 3804-3814 may be repeated (along line 3816) to form a multi-dimensional integrated chip structure having more than two tiers. FIGS. 20-25 illustrates cross-sectional views 2000-2500 of some embodiments corresponding to a repeat of acts 3804-3814 to form a multi-dimensional integrated chip structure having three substrates. FIGS. 26-31 illustrates cross-sectional views 2600-3100 of some embodiments corresponding to a repeat of acts 3804-3814 to form a multi-dimensional integrated chip structure having four substrates. FIGS. 32-37 illustrates cross-sectional views 3200-3700 of some embodiments corresponding to a repeat of acts 3804-3814 to form a multi-dimensional integrated chip structure having four substrates.

At 3818, the multi-dimensional integrated chip structure is diced to form a plurality of multi-dimensional integrated chip die.

While the method 3800 of FIG. 38 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

Therefore, the present disclosure relates to a method of performing a multi-step edge trimming process for a multi-dimensional integrated chip structure that minimizes damage to the multi-dimensional integrated chip structure.

In some embodiments, the present disclosure relates to a method for forming a multi-dimensional integrated chip structure. The method includes bonding a second substrate to an upper surface of a first substrate; performing a first edge trimming cut along a first loop and extending into a first peripheral portion of the second substrate; performing a second edge trimming cut along a second loop and extending into a second peripheral portion of the second substrate and into the first substrate; and performing a third edge trimming cut along a third loop and extending into a third peripheral portion of the first substrate. In some embodiments, the method further includes removing at least a portion of the second substrate after performing the third edge trimming cut, removing at least the portion of the second substrate resulting in the second substrate having a substantially planar upper surface that extends between outermost sidewalls of the second substrate. In some embodiments, the method further includes removing at least a portion of the second substrate after performing the third edge trimming cut, removing at least the portion of the second substrate resulting in the second substrate having a first upper surface and a second upper surface, and a first distance between the first upper surface and the first substrate is greater than a second distance between the second upper surface and the first substrate. In some embodiments, the first loop is a continuous and closed loop. In some embodiments, the method further includes thinning the second substrate before performing the first edge trimming cut. In some embodiments, performing ng the first edge trimming cut includes spinning a first blade in a first circumferential direction around a first axis extending through a center of the first blade, bringing the first blade into contact with the second substrate, and rotating the second substrate in a second circumferential direction around a second axis extending through a center of the second substrate; and performing the second edge trimming cut includes spinning a second blade in the first circumferential direction around a third axis extending through a center of the second blade, bringing the second blade into contact with the second substrate, and rotating the second substrate in a third circumferential direction opposite the second circumferential direction around the second axis. In some embodiments, performing the first edge trimming cut includes spinning a first blade around a first axis extending through a center of the first blade; bringing the first blade into contact with the second substrate; and rotating the second substrate so that the first blade travels in a same direction as the second substrate between the first axis and the second substrate. In some embodiments, performing the second edge trimming cut includes spinning a second blade around a second axis extending through a center of the second blade; bringing the second blade into contact with the second substrate; and rotating the second substrate so that the second blade travels in an opposite direction as the second substrate between the second axis and the second substrate. In some embodiments, performing the first edge trimming cut, the second edge trimming cut, and the third edge trimming cut defines a plurality of cut regions, and widths of the plurality of cut regions are respectively greater than about 10 micrometers. In some embodiments, the first edge trimming cut extends into the second substrate to a first depth that is less than a thickness of the second substrate. In some embodiments, the method further includes bonding the first substrate to the second substrate by way of a bonding region, wherein the second edge trimming cut extends past opposing sides of the bonding region.

In other embodiments, the present disclosure relates to a method for forming a three-dimensional integrated chip. The method includes bonding a lower surface of a second semiconductor wafer to an upper surface of a first semiconductor wafer; bonding a lower surface of a third semiconductor wafer to an upper surface of the second semiconductor wafer; performing a first type of edge trimming cut around a first peripheral portion of the third semiconductor wafer; performing a second type of edge trimming cut around a second peripheral portion of the third semiconductor wafer, around a third peripheral portion of the second semiconductor wafer, and around a fourth peripheral portion of the first semiconductor wafer, the second type of edge trimming cut different than the first type of edge trimming cut; and performing a third type of edge trimming cut around a fifth peripheral portion of the first semiconductor wafer. In some embodiments, performing the first type of edge trimming cut includes rotating the third semiconductor wafer; bringing a first blade in contact with the third semiconductor wafer; and spinning the first blade around a first axis so that the first blade travels in a same direction as the third semiconductor wafer between the first axis and the third semiconductor wafer. In some embodiments, performing the second type of edge trimming cut includes rotating the third semiconductor wafer; bringing a second blade in contact with the third semiconductor wafer, the second semiconductor wafer, and the first semiconductor wafer; and spinning the second blade around a second axis so that the second blade travels in an opposite direction as the third semiconductor wafer between the second axis and the third semiconductor wafer. In some embodiments, the first type of edge trimming cut extends into the third semiconductor wafer to a first depth that is less than a thickness of the third semiconductor wafer. In some embodiments, the method further includes bonding the first semiconductor wafer to the second semiconductor wafer by way of a first bonding region; bonding the second semiconductor wafer to the third semiconductor wafer by way of a second bonding region, the second type of edge trimming cut vertically extending past the first bonding region and the second bonding region. In some embodiments, the first type of edge trimming cut and the second type of edge trimming cut exert different amounts of shear stress onto a sidewall of the second semiconductor wafer.

In yet other embodiment, the present disclosure relates to a multi-dimensional integrated chip structure. The multi-dimensional integrated chip structure include a first substrate having a first upper surface and a second upper surface above the first upper surface, a first outermost perimeter of the first upper surface greater than a second outermost perimeter of the second upper surface; and a second substrate over the first substrate, the second substrate having a third upper surface above the second upper surface, and a third outermost perimeter of the third upper surface is less than the second outermost perimeter of the second upper surface. In some embodiments, the second substrate further includes a fourth upper surface above the third upper surface, the third outermost perimeter of the third upper surface is greater than a fourth outermost perimeter of the fourth upper surface, and the fourth upper surface is an uppermost surface of the second substrate. In some embodiments, the first substrate includes an uppermost surface having an outermost perimeter that is less than the second outermost perimeter and approximately equal to third outermost perimeter.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. An integrated chip structure, comprising:
 a first substrate comprising a first horizontally extending surface and a second horizontally extending surface above the first horizontally extending surface as viewed in a cross-sectional view, wherein the first horizontally extending surface continuously wraps around an outermost perimeter of the second horizontally extending surface in a closed loop as viewed in a plan-view;
 a second substrate disposed over the first substrate and comprising a third horizontally extending surface above the second horizontally extending surface as viewed in the cross-sectional view, wherein the second horizontally extending surface continuously wraps around an outermost perimeter of the third horizontally extending surface in a closed loop as viewed in the plan-view;

wherein the first horizontally extending surface is a flat surface that is entirely laterally outside of the second substrate; and wherein the second horizontally extending surface is a flat surface that is entirely laterally outside of the second substrate and that is vertically between an overlying sidewall of the first substrate and an underlying sidewall of the first substrate.

2. The integrated chip structure of claim 1, wherein the first horizontally extending surface and the second horizontally extending surface are respectively vertically separated from a bottommost surface and a topmost surface of the first substrate by non-zero distances.

3. The integrated chip structure of claim 1, further comprising:
a third substrate vertically between the first substrate and the second substrate, wherein the third substrate has a width that is substantially equal to a top surface of the first substrate and a bottom surface of the second substrate.

4. The integrated chip structure of claim 1, wherein a topmost surface of the first substrate has a first maximum diameter that is substantially equal to a second maximum diameter of a bottommost surface of the second substrate.

5. The integrated chip structure of claim 4, further comprising:
a third substrate vertically between the first substrate and the second substrate, wherein a vertical distance between the second horizontally extending surface and the third horizontally extending surface is larger than a thickness of the third substrate.

6. The integrated chip structure of claim 1, wherein the second substrate comprises a silicon body and a dielectric structure, the dielectric structure being disposed on the silicon body and surrounding one or more conductive interconnects.

7. The integrated chip structure of claim 6, wherein the second substrate is directly between the third horizontally extending surface and the dielectric structure.

8. The integrated chip structure of claim 6, wherein the second horizontally extending surface has a first outer edge and a second outer edge disposed along a same side of the second substrate, as viewed in the cross-sectional view.

9. The integrated chip structure of claim 1, wherein the first horizontally extending surface has a greater width than the second horizontally extending surface.

10. An integrated chip structure, comprising:
a first substrate comprising a bottom surface having a first width, a top surface having a second width that is smaller than the first width, and an intermediate surface vertically between the top surface and the bottom surface, the intermediate surface being a flat surface that continuously extends from an outermost perimeter of the first substrate to directly above the bottom surface;
a second substrate disposed over the top surface of the first substrate, wherein the second substrate has a bottom surface facing the first substrate and a top surface facing away from the first substrate;
wherein the bottom surface of the second substrate has a third width and the top surface of the second substrate has a fourth width that is smaller than the third width; and
wherein the first substrate has an intermediate width measured at a vertical position between the top surface of the first substrate and the bottom surface of the first substrate, the intermediate width being smaller than the first width and larger than the second width.

11. The integrated chip structure of claim 10, wherein the first substrate further comprises a second intermediate surface vertically between the top surface and the intermediate surface, the intermediate surface and the second intermediate surface being entirely laterally outside of the second substrate.

12. The integrated chip structure of claim 10, further comprising:
a plurality of interconnects disposed within an inter-level dielectric (ILD) structure, wherein the ILD structure is arranged between the top surface of the first substrate and the bottom surface of the second substrate.

13. The integrated chip structure of claim 10, wherein the first substrate has a greater thickness than the second substrate.

14. An integrated chip structure, comprising:
a first substrate comprising a first semiconductor body;
a second substrate attached to the first substrate to define a multi-dimensional integrated chip structure, wherein the second substrate comprises a second semiconductor body;
a third substrate between the first substrate and the second substrate, the third substrate having a width that is equal to widths of a top surface of the first substrate and a bottom surface of the second substrate, wherein the second substrate is vertically separated from the first substrate and the third substrate by interconnect structures including conductive interconnects surrounded by one or more dielectric materials, as viewed in a cross-sectional view; and
wherein the first substrate has a first stepped profile and the second substrate has a second stepped profile as viewed in the cross-sectional view.

15. The integrated chip structure of claim 14, wherein the first semiconductor body and the second semiconductor body respectively have stepped profiles.

16. The integrated chip structure of claim 14, wherein the first substrate comprises a first dielectric structure disposed on the first semiconductor body and surrounding a first plurality of conductive interconnects, the first semiconductor body having a stepped profile as viewed in the cross-sectional view.

17. The integrated chip structure of claim 16,
wherein the second substrate comprises a second dielectric structure disposed between the first semiconductor body and the second semiconductor body, the second dielectric structure surrounding a second plurality of conductive interconnects; and
wherein the second semiconductor body has a stepped profile as viewed in the cross-sectional view.

18. The integrated chip structure of claim 14,
wherein the first semiconductor body comprises an outermost sidewall, a first sidewall, and a second sidewall facing a same direction; and
wherein the first sidewall is a first non-zero distance from the outermost sidewall and the second sidewall is a second non-zero distance from the first sidewall.

19. The integrated chip structure of claim 18, wherein the first non-zero distance and the second non-zero distance are at least 10 micrometers.

20. The integrated chip structure of claim 14,
wherein the second semiconductor body comprises an outermost sidewall and a first sidewall facing a same direction; and wherein the first sidewall is a non-zero distance from the outermost sidewall.

\* \* \* \* \*